(12) United States Patent
Reddy

(10) Patent No.: US 8,438,330 B2
(45) Date of Patent: May 7, 2013

(54) UPDATING CAM ARRAYS USING PREFIX LENGTH DISTRIBUTION PREDICTION

(75) Inventor: Parineeth M. Reddy, Bangalore (IN)

(73) Assignee: Netlogic Microsystems, Inc., Irvine, CA (US)

( * ) Notice: Subject to any disclaimer, the term of this patent is extended or adjusted under 35 U.S.C. 154(b) by 175 days.

(21) Appl. No.: 13/051,247

(22) Filed: Mar. 18, 2011

(65) Prior Publication Data

US 2011/0283061 A1 Nov. 17, 2011

Related U.S. Application Data

(60) Provisional application No. 61/345,503, filed on May 17, 2010.

(51) Int. Cl.
*G06F 12/04* (2006.01)

(52) U.S. Cl.
USPC .......................................... 711/106; 711/173

(58) Field of Classification Search .................. 711/108, 711/173
See application file for complete search history.

(56) References Cited

U.S. PATENT DOCUMENTS

| | | | |
|---|---|---|---|
| 4,606,002 A | 8/1986 | Waisman et al. |
| 4,670,858 A | 6/1987 | Almy |
| 4,928,260 A | 5/1990 | Chuang et al. |
| 5,010,516 A | 4/1991 | Oates |
| 5,053,991 A | 10/1991 | Burrows |
| 5,228,115 A | 7/1993 | Natarajan |
| 5,239,642 A | 8/1993 | Gutierrez et al. |
| 5,261,088 A | 11/1993 | Baird et al. |
| 5,319,763 A | 6/1994 | Ho et al. |
| 5,386,413 A | 1/1995 | McAuley et al. |
| 5,422,838 A | 6/1995 | Lin |
| 5,430,869 A | 7/1995 | Ishak et al. |
| 5,446,887 A | 8/1995 | Berkowitz |
| 5,475,825 A | 12/1995 | Yonezawa et al. |
| 5,475,837 A | 12/1995 | Ishak et al. |
| 5,560,007 A | 9/1996 | Thai |
| 5,574,910 A | 11/1996 | Bialkowski et al. |
| 5,644,763 A | 7/1997 | Roy |
| 5,649,149 A | 7/1997 | Stormon et al. |
| 5,666,494 A | 9/1997 | Mote, Jr. |
| 5,745,488 A | 4/1998 | Thompson et al. |
| 5,758,356 A | 5/1998 | Hara et al. |
| 5,787,430 A | 7/1998 | Doeringer et al. |
| 5,813,000 A | 9/1998 | Furlani |
| 5,822,749 A | 10/1998 | Agarwal |

(Continued)

FOREIGN PATENT DOCUMENTS

| WO | WO99/23664 | 5/1999 |
|---|---|---|
| WO | WO2004088548 | 10/2004 |

*Primary Examiner* — Hal Schnee
(74) *Attorney, Agent, or Firm* — Sterne, Kessler, Goldstein & Fox P.L.L.C.

(57) ABSTRACT

A method and apparatus for ordering a plurality (P) of entries having various prefix lengths for storage in a number (T) of available storage locations in a content addressable memory (CAM) array according to the prefix lengths is disclosed. Initially, a first number (N) of the entries of selected and used to generate a distribution graph of their prefix lengths. Then, for each unique prefix length, a corresponding subset of the T storage locations in the CAM array are allocated according to a predicted prefix length distribution indicated by the distribution graph. Then, all of the entries are stored in the corresponding allocated storage locations according to prefix length.

27 Claims, 21 Drawing Sheets

U.S. PATENT DOCUMENTS

| | | |
|---|---|---|
| 5,841,874 A | 11/1998 | Kempke et al. |
| 5,860,085 A | 1/1999 | Stormon et al. |
| 5,893,931 A | 4/1999 | Peng et al. |
| 5,897,655 A | 4/1999 | Mallick |
| 5,918,245 A | 6/1999 | Yung |
| 5,920,886 A | 7/1999 | Feldmeier |
| 5,924,115 A | 7/1999 | Von Herzen et al. |
| 6,000,008 A | 12/1999 | Simcoe |
| 6,006,306 A | 12/1999 | Haywood et al. |
| 6,018,524 A | 1/2000 | Turner et al. |
| 6,065,064 A | 5/2000 | Satoh et al. |
| 6,081,440 A | 6/2000 | Washburn et al. |
| 6,098,150 A | 8/2000 | Brethour et al. |
| 6,115,792 A | 9/2000 | Tran |
| 6,138,123 A | 10/2000 | Rathburn |
| 6,154,384 A | 11/2000 | Natarajan et al. |
| 6,192,051 B1 | 2/2001 | Lipman et al. |
| 6,215,816 B1 | 4/2001 | Gillespie et al. |
| 6,223,172 B1 | 4/2001 | Hunter et al. |
| 6,237,061 B1 | 5/2001 | Srinivasan et al. ............ 711/108 |
| 6,289,414 B1 | 9/2001 | Feldmeier et al. |
| 6,374,326 B1 | 4/2002 | Kansal et al. |
| 6,378,042 B1 | 4/2002 | Henderson et al. |
| 6,385,649 B1 | 5/2002 | Draves et al. |
| 6,502,163 B1 * | 12/2002 | Ramankutty ................. 711/108 |
| 6,546,391 B1 | 4/2003 | Tsuruoka |
| 6,571,313 B1 | 5/2003 | Filippi et al. |
| 6,735,600 B1 | 5/2004 | Andreev et al. |
| 6,963,924 B1 | 11/2005 | Huang et al. |
| 7,162,481 B2 | 1/2007 | Richardson et al. |
| 7,249,228 B1 | 7/2007 | Agarwal et al. |
| 7,266,085 B2 | 9/2007 | Stine |
| 7,299,399 B2 | 11/2007 | Huang |
| 7,313,666 B1 | 12/2007 | Saminda De Silva et al. |
| 7,392,349 B1 | 6/2008 | Mathur et al. ................. 711/141 |
| 7,426,518 B2 | 9/2008 | Venkatachary et al. |
| 7,571,156 B1 | 8/2009 | Gupta et al. ..................... 707/3 |
| 7,610,440 B2 | 10/2009 | Husby |
| 7,697,518 B1 | 4/2010 | de Wit .......................... 370/389 |
| 2005/0102428 A1 * | 5/2005 | Heintze et al. ................. 709/245 |
| 2008/0186970 A1 * | 8/2008 | Wisener et al. ............... 370/392 |

* cited by examiner

UPDATING CAM ARRAYS USING PREFIX LENGTH DISTRIBUTION PREDICTION

CROSS-REFERENCE TO RELATED APPLICATION

This application claims the benefit under 35 USC 119(e) of the co-pending and commonly owned U.S. Provisional Application No. 61/345,503 entitled "Fast Updating Algorithm For TCAMs Using Prefix Distribution Prediction" filed on May 17, 2010, which is incorporated herein by reference.

TECHNICAL FIELD

The disclosure herein relates generally to packet routing and specifically to updating CAM-based search tables in network routers.

DESCRIPTION OF RELATED ART

Internet routing involves forwarding packets from a source address to a destination address via intermediate routers. To send an incoming packet to its destination address, a router looks up the destination address in the packet in its forwarding table and determines the next hop to which the packet should be forwarded. As more devices are connected to the internet, the size of the forwarding table in the routers has increased significantly. According to BGP Potaroo database, the size of the forwarding table has increased from about 20,000 entries in 1994 to about 350,000 entries today. The enormous increase of internet traffic over the years has resulted in routers having to increase the number of searches performed per second. Routers typically perform forwarding table look ups in the order of several million look ups per second.

Internet routers store destination addresses in forwarding tables, which are often implemented using content addressable memory (CAM) devices. Indeed, CAM devices are frequently used in network switching and routing applications to determine forwarding destinations, to perform classification functions, to implement Quality of Service (QoS) functions, and other tasks associated with routing data packets across a network. For example, routers used by local Internet Service Providers (ISPs) typically include one or more CAM devices for storing a plurality of Internet addresses and associated data such as, for instance, corresponding address routing information. When a data packet is routed to a destination address, the destination address is provided as a search key to the CAM device and then compared with all CAM words (e.g., Internet addresses) stored in the CAM array. If there is a match between the search key and data stored in the CAM array, match information corresponding to the matching CAM word is output and thereafter used to route the data.

For example, FIG. 1 shows a network processing system 100 having a network processor 110 and a CAM system 120 including a CAM device 121 and an associated memory device 123. Network processor 110, which is well-known, includes a first port coupled to the physical or media access controller (PHY/MAC) layer of an associated network such as the Internet (not shown for simplicity), and a second port coupled to CAM system 120 via signal lines 101. CAM device 121, which is well-known, includes a CAM core 122 having an array of CAM cells for storing a plurality of data words. Memory device 123, which is well-known, is connected to CAM device 121 via signal lines 102 and includes an array of memory cells such as DRAM cells for storing associated data for CAM device 121. For example, in some applications, the array of CAM cells in CAM device 121 may store destination addresses, and memory 123 may store associated routing information associated with the destination addresses.

In operation, network processor 110 receives an IP packet having a header and a payload from the PHY/MAC layer. The payload typically includes data to be routed across the network, and the header typically includes routing information (e.g., a source address, a destination address, a source port, a destination port, and protocol information). Network processor 110 stores the payload, and generates a search key (KEY) from the packet header. Then, network processor 110 provides KEY and an instruction (INST) to CAM system 120. The instruction is decoded in CAM device 121 to initiate a well-known compare operation between KEY and the IP addresses stored in the CAM core's array. If there is a match, CAM core 122 outputs the index (IDX) of the highest priority matching location to memory device 123, which in turn uses IDX as an address to retrieve associated data (DOUT), which may be provided to network processor 110. Network processor 110 may use DOUT, for example, to route the corresponding packet to a next-hop location in the network.

Ternary CAM (TCAM) devices are popular for implementing forwarding tables for IP addresses having variable prefix lengths (e.g., IPv6 addresses) because a TCAM cell can represents 3 states: logic 0, logic 1, and a don't care state (X). More specifically, the ability of TCAM cells to store a don't care state allows each entry stored in the TCAM device to be individually masked, which in turn allows IP addresses having different prefix lengths to be stored in the same CAM array and compared with a search key in the same search operation. To achieve longest prefix matching in a TCAM device, the addresses are stored in the CAM array according to prefix length, where addresses having the longest prefixes are stored at the lowest physical address and addresses having the shortest prefixes are stored at the highest physical address. In this manner, if multiple entries stored in the TCAM device match an incoming search key, the matching entry that is stored at the lowest physical address is selected as the longest prefix match (LPM) because of the ordering of addresses according to prefix length. The use of TCAM devices to perform LPM operations (e.g., to implement IPv6 routing functions) is described in more detail in commonly owned U.S. Pat. No. 6,237,061, which is incorporated herein by reference.

However, performing LPM searches in a TCAM device requires maintaining the ordering of entries according to prefix length, which is typically implemented using a table management tool. For example, when a new entry is written to the TCAM array, the table management tool must re-order (e.g., shuffle) some or all of the entries to maintain proper ordering of the entries according to prefix length. The re-ordering of entries in the TCAM array can add significant overhead to the associated router (e.g., delay and additional hardware and software), which in turn degrades performance. For example, if N is the total number of unique prefix lengths that are stored in the TCAM, then for inserting a single new entry, N−1 shuffles are required in the worst case (e.g., if the newly inserted entry is stored at the lowest physical address of the TCAM array). The technique of shuffling existing entries in the TCAM array as new entries are inserted without reserving any empty locations (which are commonly referred to as "holes") is commonly known as "No Hole Allocation."

Some techniques have been developed to decrease the number of shuffles required for TCAM table updates. In one approach commonly known as "Center Hole Distribution," holes (e.g., empty storage locations) are maintained in the middle of the TCAM array to reduce the number of entries that need to be shuffled when a new entry is inserted in the array. For example, if there are N unique prefix lengths in the TCAM array, then entries having prefix lengths between N−1 and N/2 are stored in locations above the holes, and entries having prefix lengths between N/2−1 and 0 are stored in locations below the holes. With this technique, the worst case number of shuffles needed when a new entry is inserted into the TCAM array is reduced from N−1 to N/2. Although the center hole allocation technique reduces the number of shuffles in some circumstances and can be implemented in the control plane software, reserving a number of empty storage locations in the middle of the TCAM array to accommodate for the subsequent insertion of new entries results in an undesirable waste of array resources.

In another approach commonly known as "Uniform Hole Distribution," an equal number of holes are reserved in the TCAM array for each unique prefix length prior to the insertion of any entries, thereby ensuring that storage locations are reserved for new entries regardless of their prefix length. In this manner, shuffles can be significantly reduced because there are groups of holes reserved at intermittent portions in the CAM array. Unfortunately, the Uniform Hole Distribution technique can lead to an even less efficient use of TCAM storage locations than the Center Hole Distribution technique.

Other approaches have been developed to eliminate the need for entry shuffling by modifying the TCAM hardware. In one approach, the TCAM array is modified by adding OR circuits in the mask column to select the longest mask among the matched entries, thereby avoiding the need to maintain ordering according to prefix length. In another approach, the TCAM array is divided by output port into several smaller TCAM blocks each assigned to store addresses having a corresponding prefix length, and associated SRAM cells are used to store the prefix length assigned to each CAM blocks. Then, during search operations, the TCAM blocks are searched in parallel, and each TCAM block having a matching entry provides its assigned prefix length to a selection logic that determines which TCAM block having a matching entry is assigned to the longest prefix. In this manner, the entries do not need to continually updated to maintain ordering according to prefix length. The problem with such approaches is that they require changes in the TCAM architecture, which can be expensive. Further, because such approaches involve modifying the TCAM array structure, they cannot be readily implemented in TCAM devices currently deployed in network applications.

Thus, there is a need for a more efficient method for updating forwarding tables implemented in CAM arrays that does not require additional hardware.

BRIEF DESCRIPTION OF THE DRAWINGS

The present embodiments are described herein by way of example, and not by way of limitation, in the figures of the accompanying drawings and in which like reference numerals refer to similar elements, as follows.

DETAILED DESCRIPTION

Figure 1:
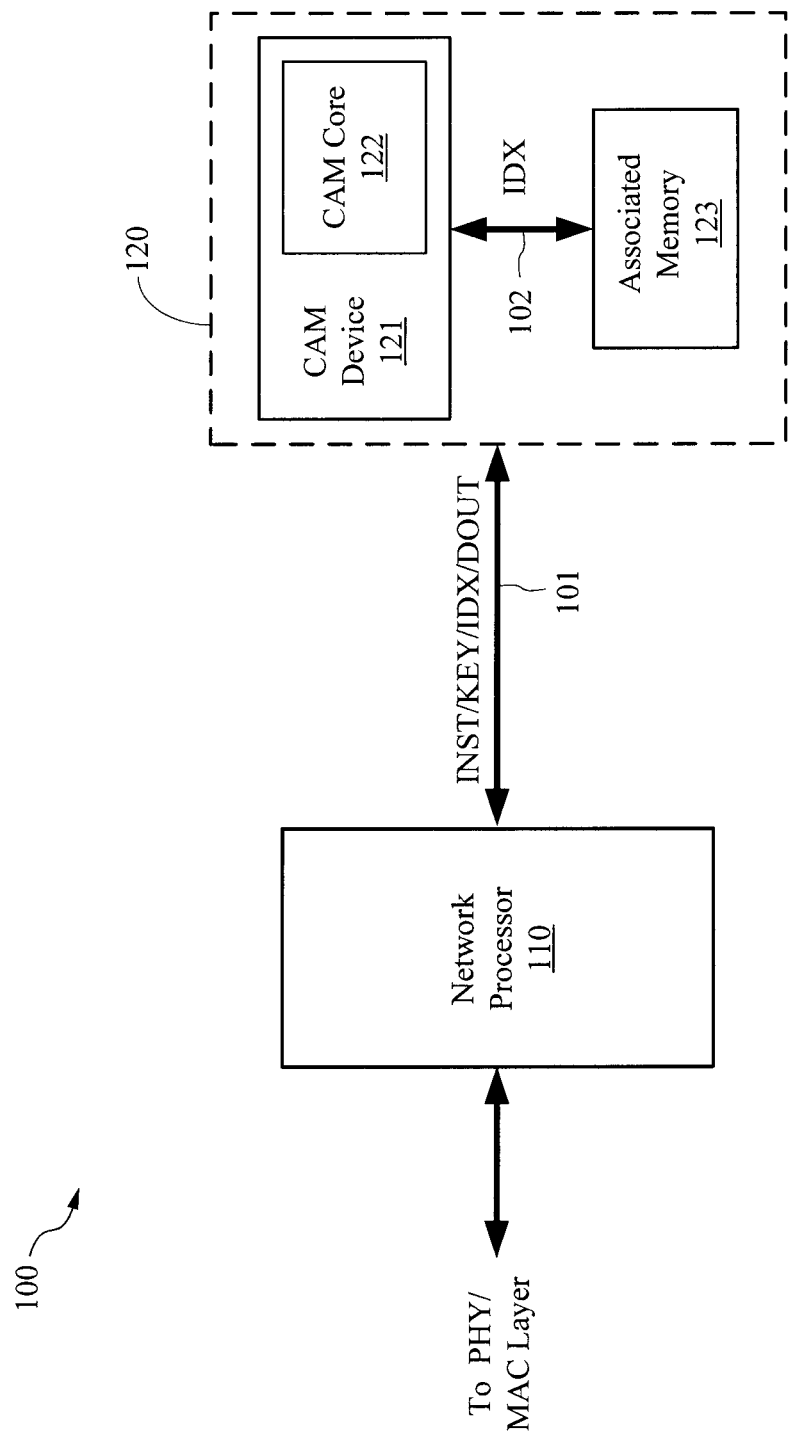
FIG. 1 is a block diagram of a network processing system.

A method and apparatus for updating a content addressable memory (CAM) array using prefix length distribution prediction are disclosed. In the following description, numerous specific details are set forth such as examples of specific components, circuits, and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of myriad physical or logical mechanisms for communication between components. The present embodiments are not to be construed as limited to specific examples described herein but rather include within their scope all embodiments defined by the appended claims.

A method and apparatus are disclosed for updating forwarding table entries in a more efficient manner than prior techniques allow. In accordance with present embodiments, a system that can be used for longest prefix match (LPM) operations is disclosed that includes a CAM array and an associated table management processor. The table management processor is configured to order a plurality of entries having various prefix lengths for storage in the CAM array according to prefix length, and to maintain the ordering relationship as new entries are inserted in the CAM array and/or as old entries are deleted from the CAM array in a manner that requires significantly less shuffle operations than conventional techniques. Further, some of the present embodiments can be implemented in the control plane without requiring any changes to the CAM array architecture, and therefore can be readily implemented in existing CAM architectures (e.g., as a software update).

For some embodiments, the table management processor, which for some embodiments can be implemented as a software program executed by a suitable processor in the control plane of an associated routing device, selects a number (N) of the plurality of entries to be stored in the CAM array and generates a prefix length distribution graph that indicates how many of the selected entries have each prefix length. For example, for one embodiment, each unique prefix length associated with the selected entries is identified, and then the percentages of the selected entries that have each unique prefix length are calculated. The prefix length distribution graph, which serves to predict the prefix lengths of the remaining entries (e.g., the non-selected ones of the plurality of entries) to be stored in the CAM array, is then used to allocate storage locations in the CAM array as a function of prefix length. For one embodiment, the percentages embodied in the prefix length distribution graph are then multiplied by the total number of storage locations in the CAM array to determine how many storage locations should be allocated for each prefix length.

More specifically, for one embodiment, no holes are initially reserved in the CAM array. However, for other embodiments, any suitable technique can be used to initially reserved a number of holes in the CAM array. After a first number N of entries is inserted (e.g., stored) in the CAM array, the first N entries are copied to a buffer and used by the table management processor to generate the prefix length distribution graph. Then, a plurality of hole groups, each derived for a corresponding unique prefix length using the prefix length distribution graph, are inserted into the CAM array. The first N entries are then re-arranged in the CAM array so that they are stored in holes allocated for their respective prefix lengths. The remaining entries are then inserted into holes allocated for their respective prefix lengths. If the holes allocated for a given prefix length are exhausted, then a table shuffle operation is performed if a new entry having the same prefix length is to be inserted.

Figure 9A:
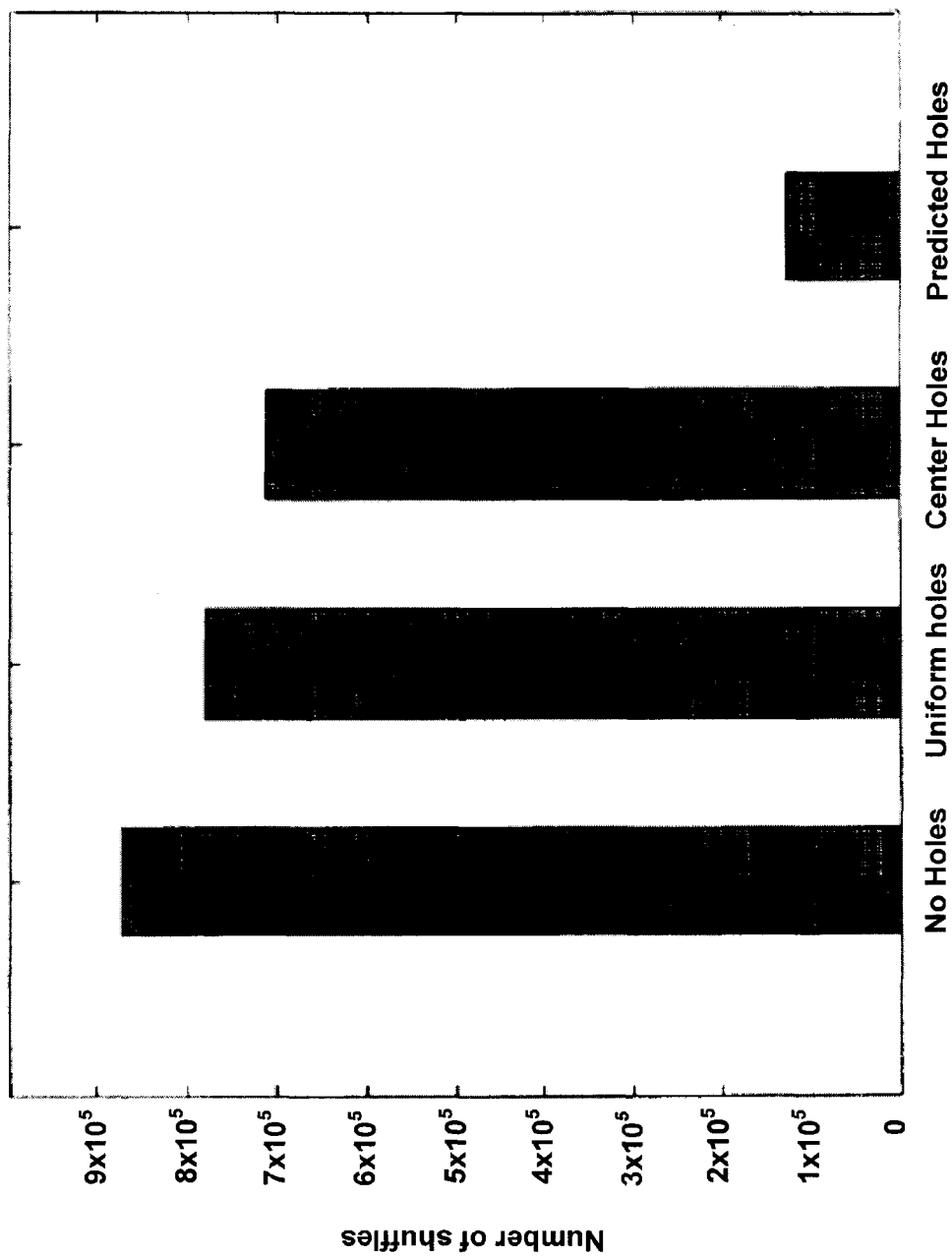
FIGS. 9A-9C depict exemplary comparisons of the number of shuffles associated with forwarding table updates in accordance with some embodiments with conventional hole allocation techniques.
Figure 9B:
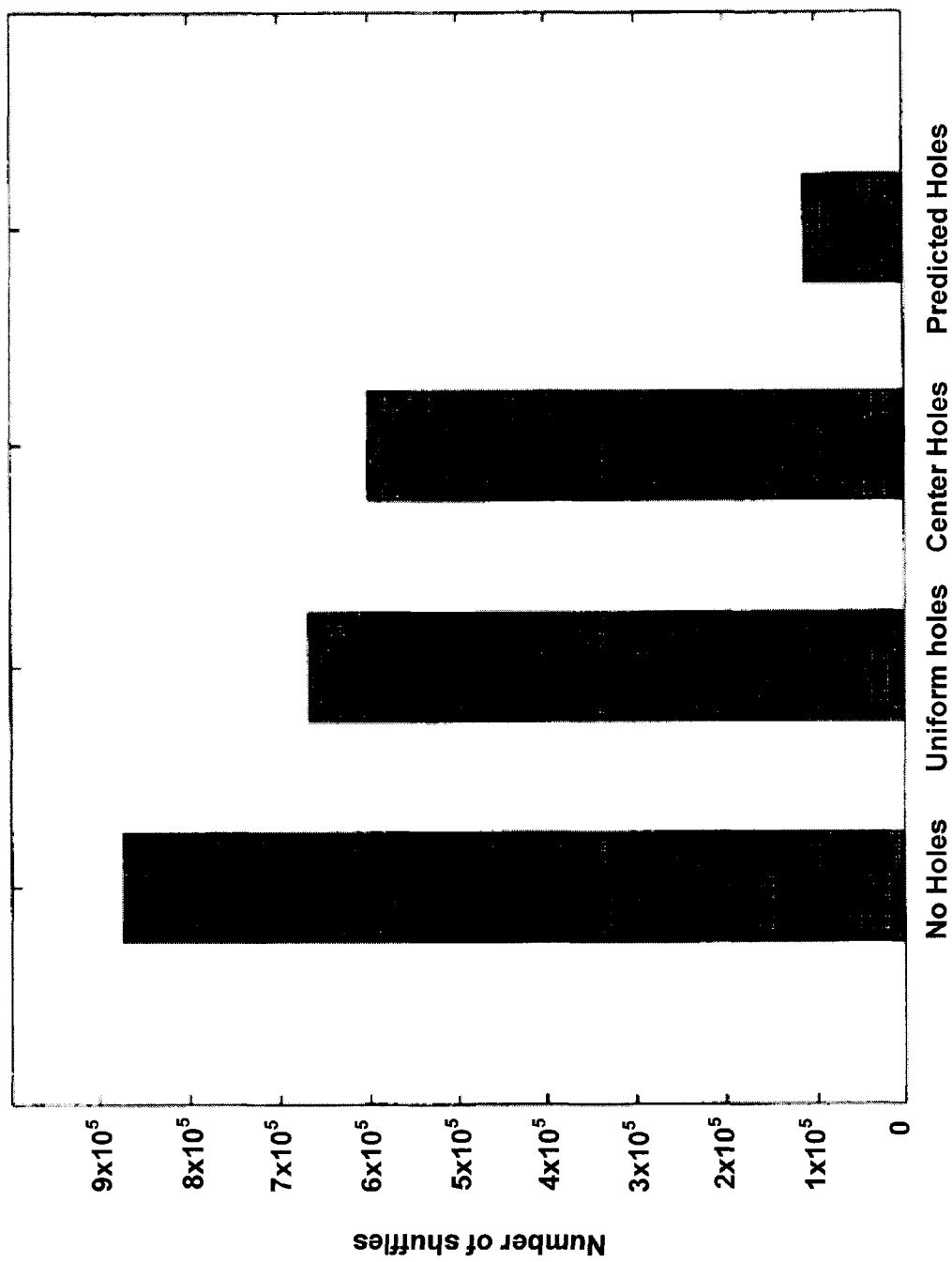
Figure 9C:
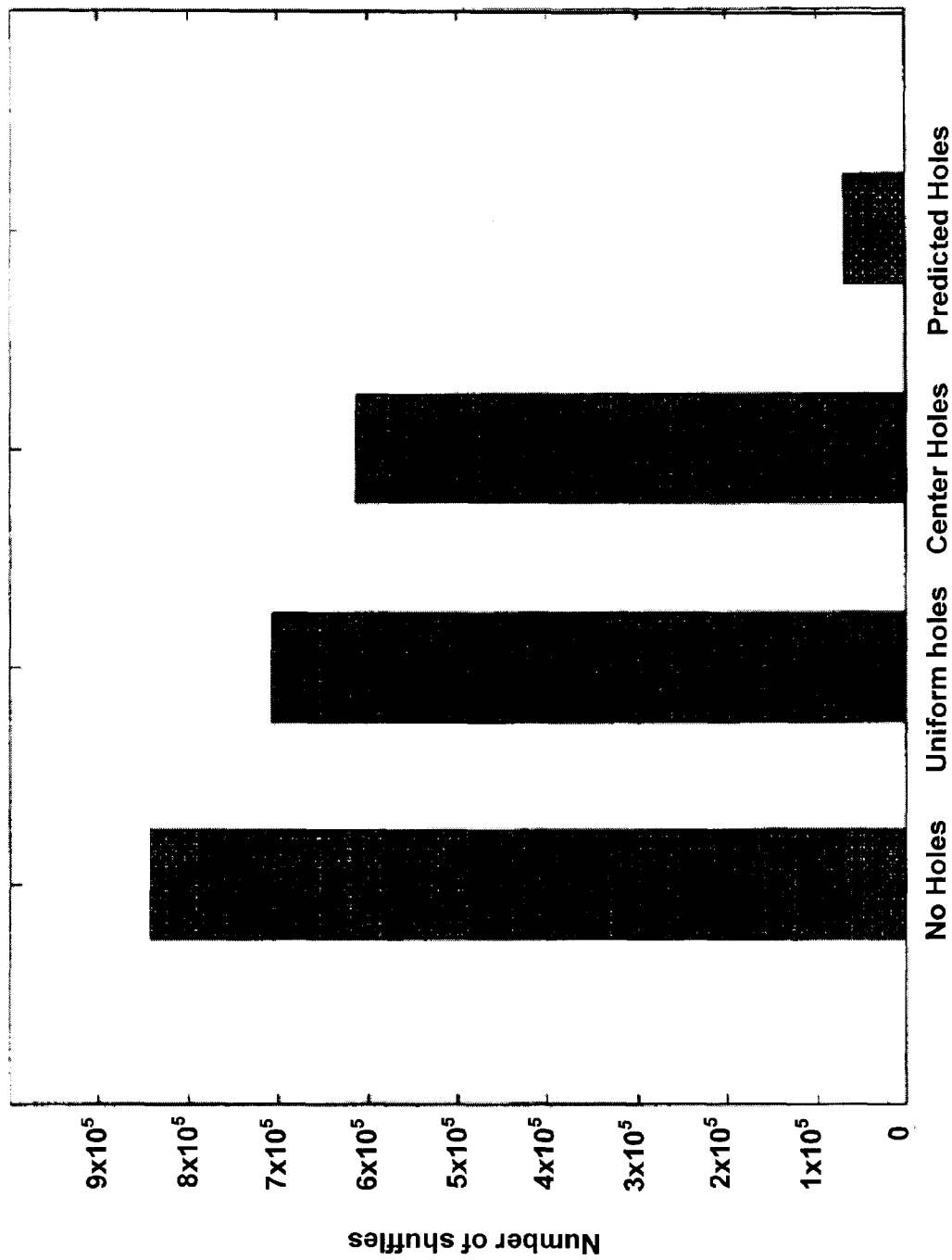
Figure 7:
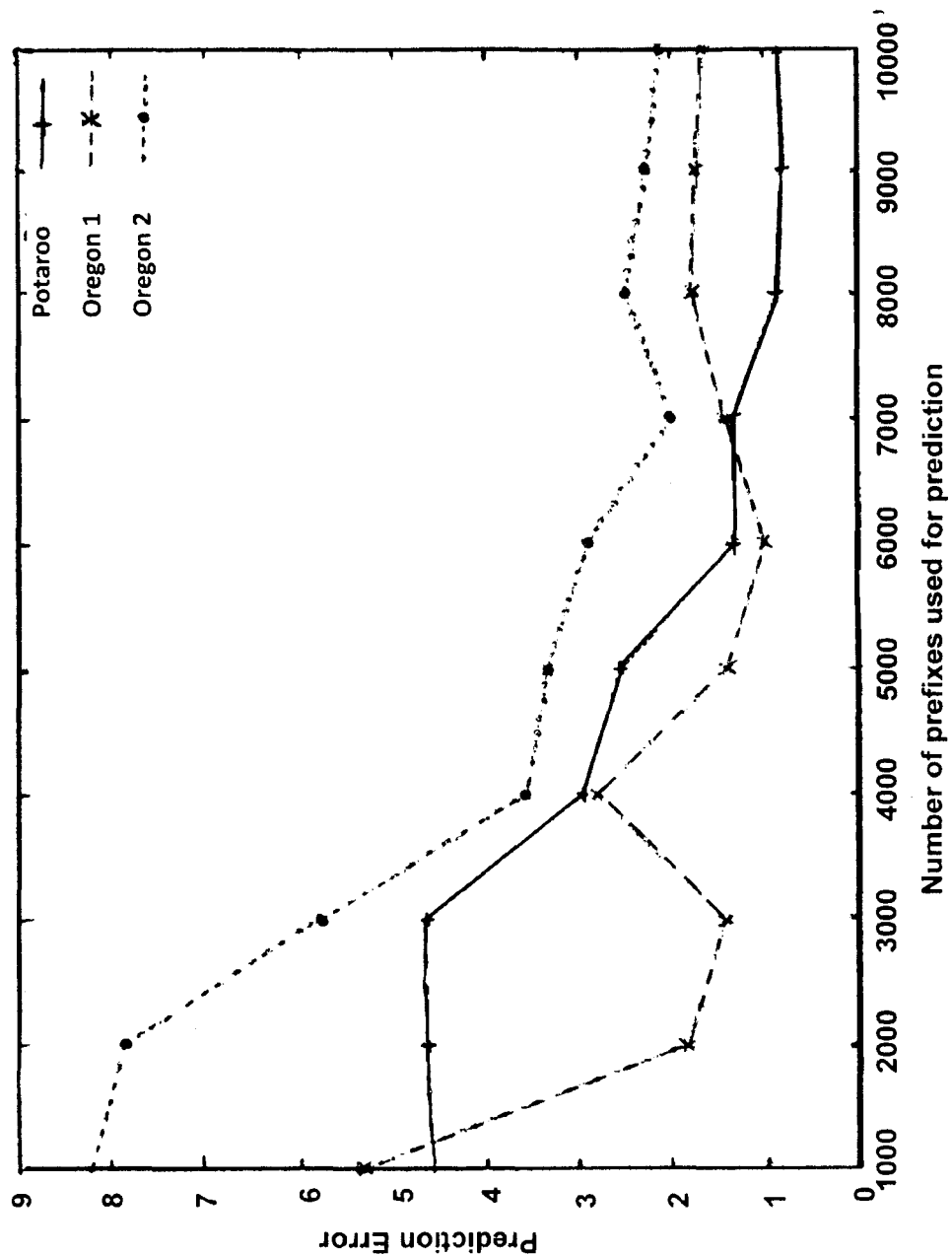
Figure 8A:
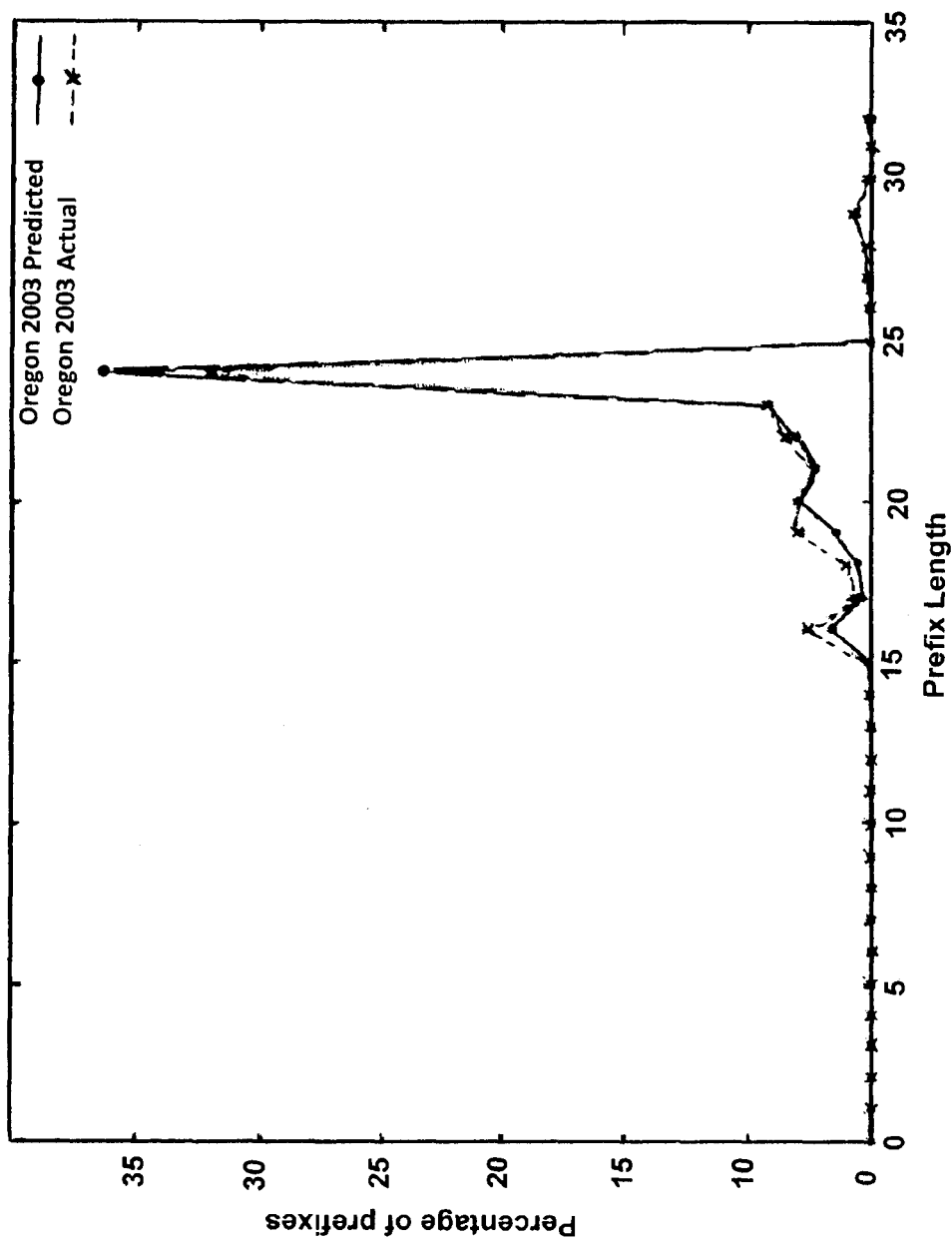
Figure 8B:
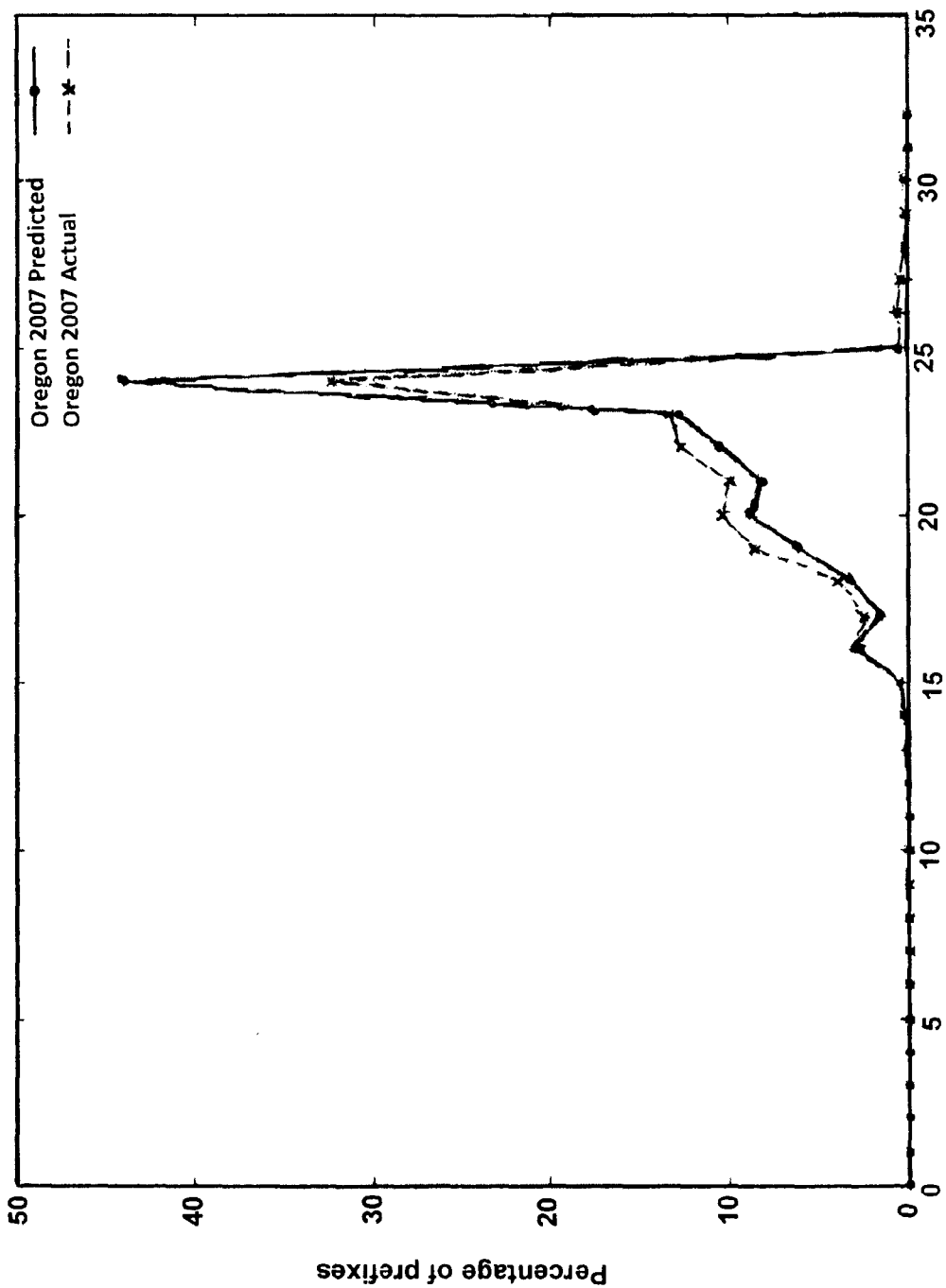
Figure 8C:
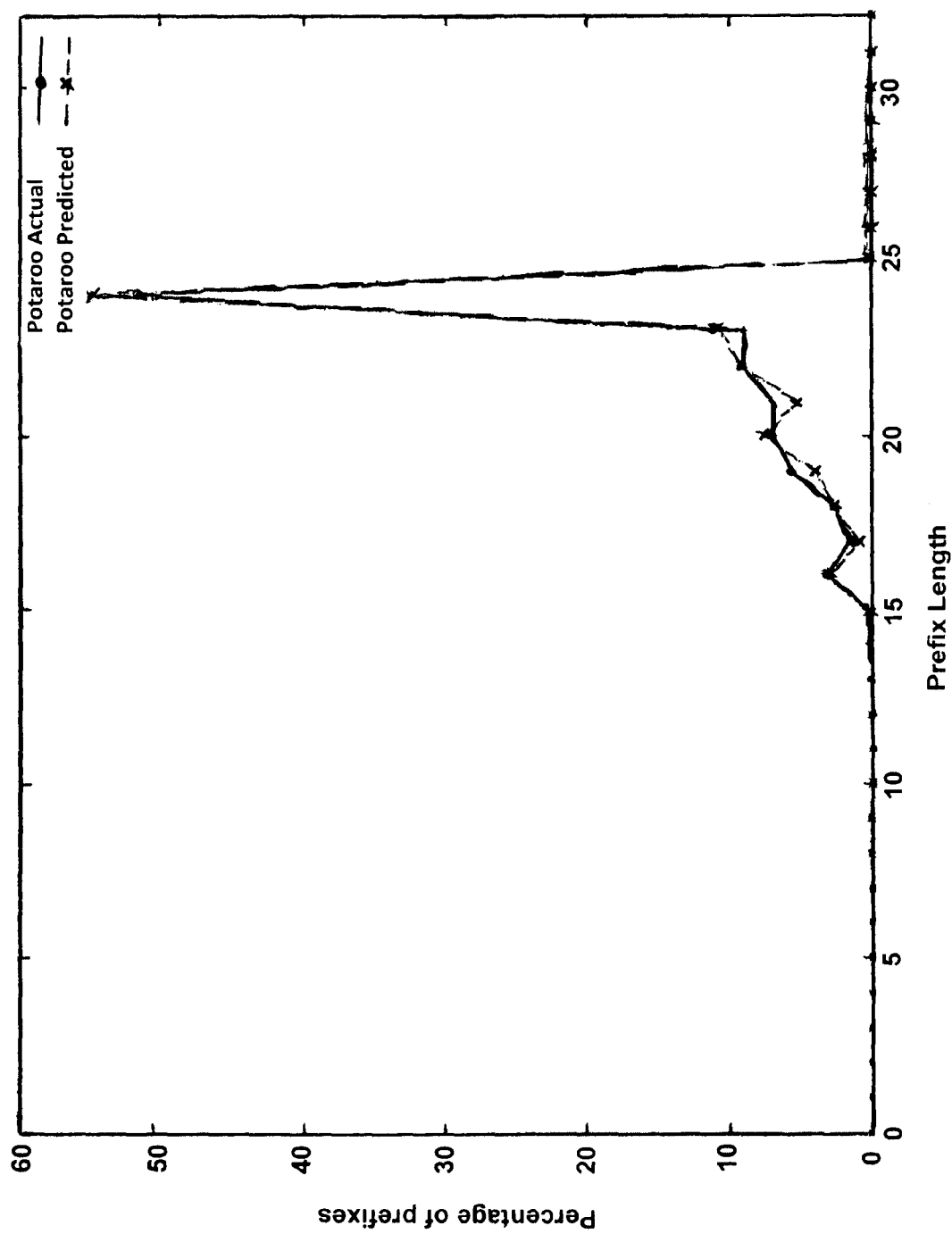
Figure 9A:
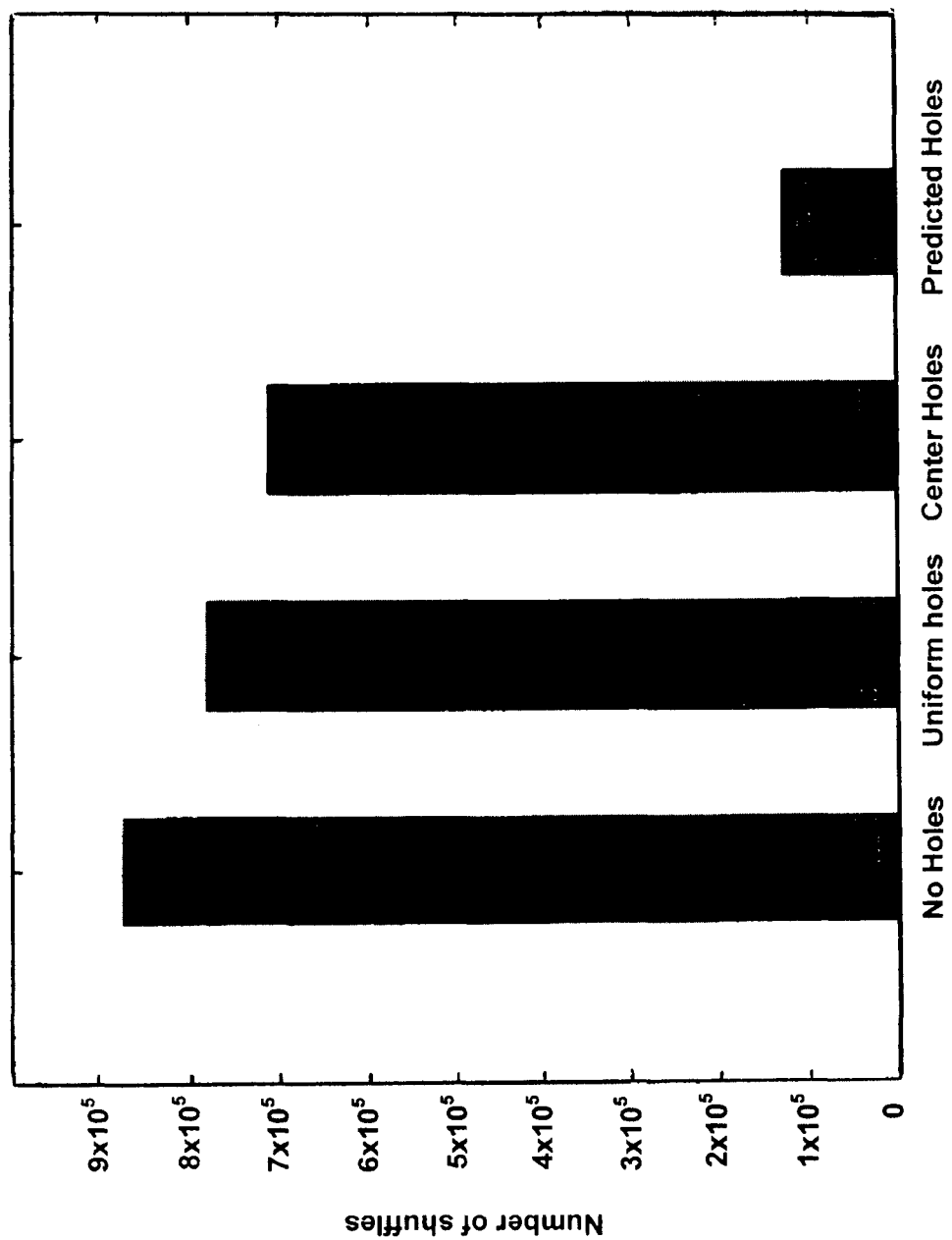
Figure 9B:
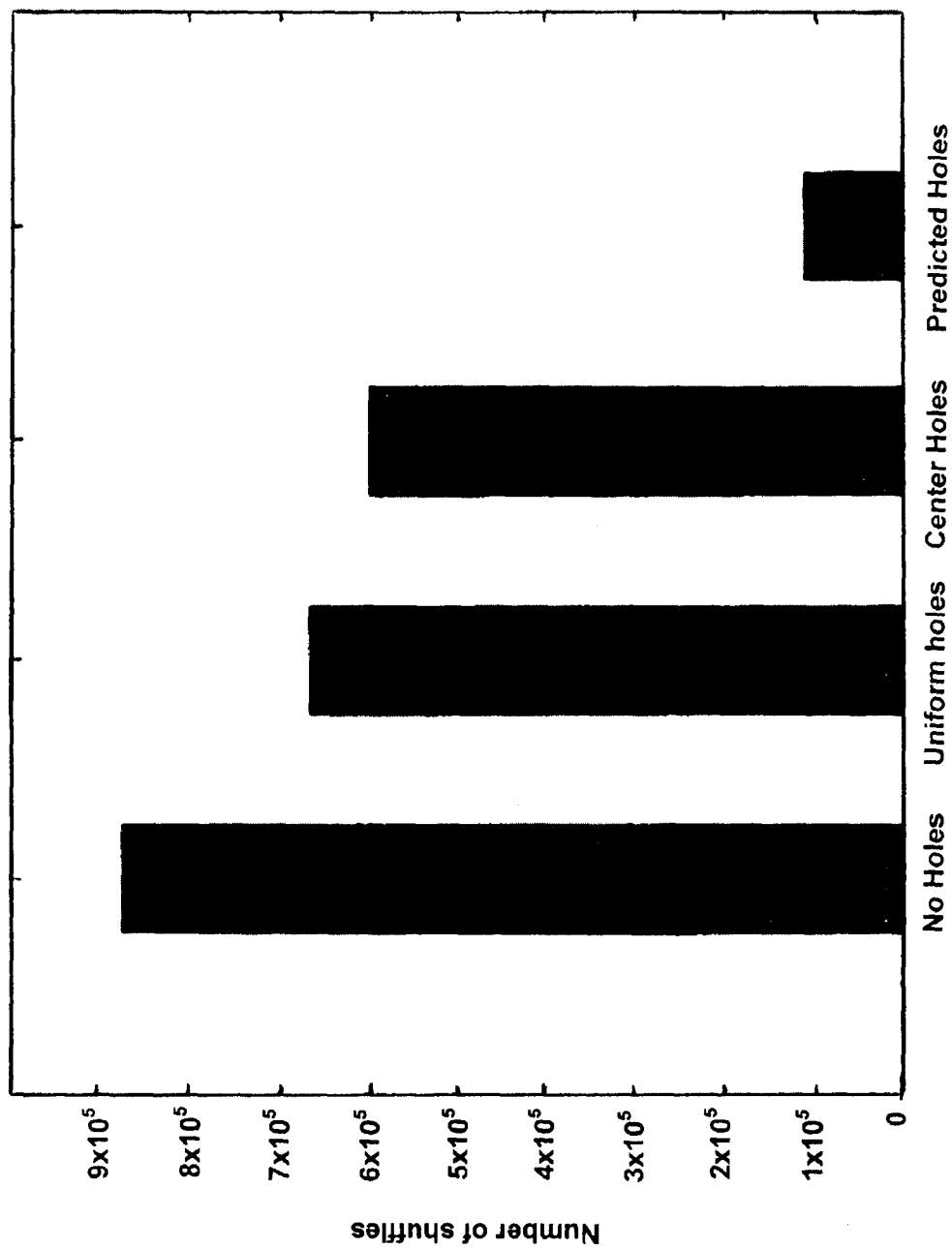
Figure 9C:
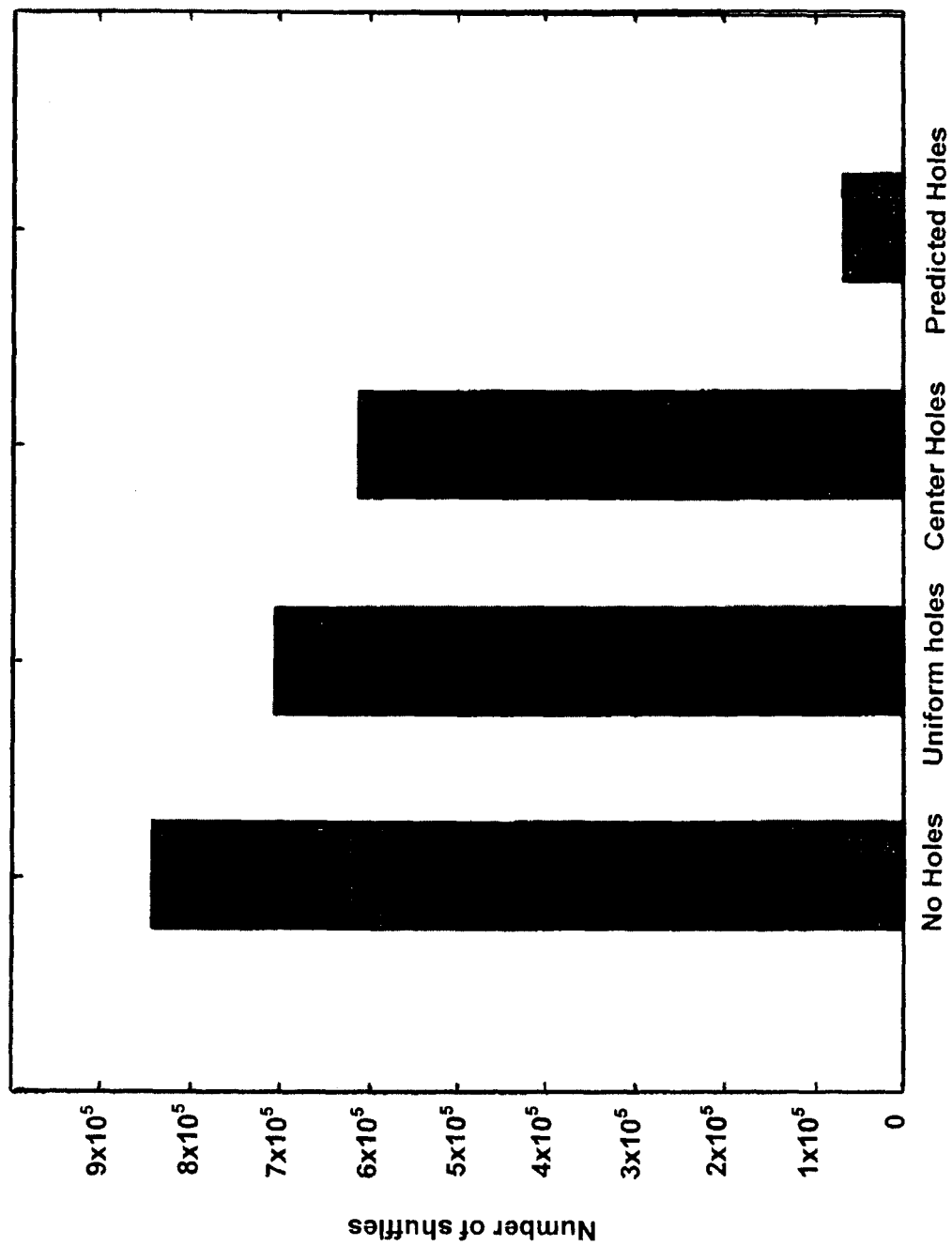

Applicant has determined that the prefix length distribution graph generated using a small subset of a large number of routing table entries accurately predicts the prefix lengths of the remaining entries, and therefore allocating varying numbers of holes (e.g., available CAM storage locations) for different prefix lengths according to the prefix length distribution graph significantly reduces the number of shuffles required to maintain a proper ordering of entries according to prefix lengths as described in more detail below and, for example, illustrated by the comparative graphs depicted in FIGS. 9A-9C.

Figure 2:
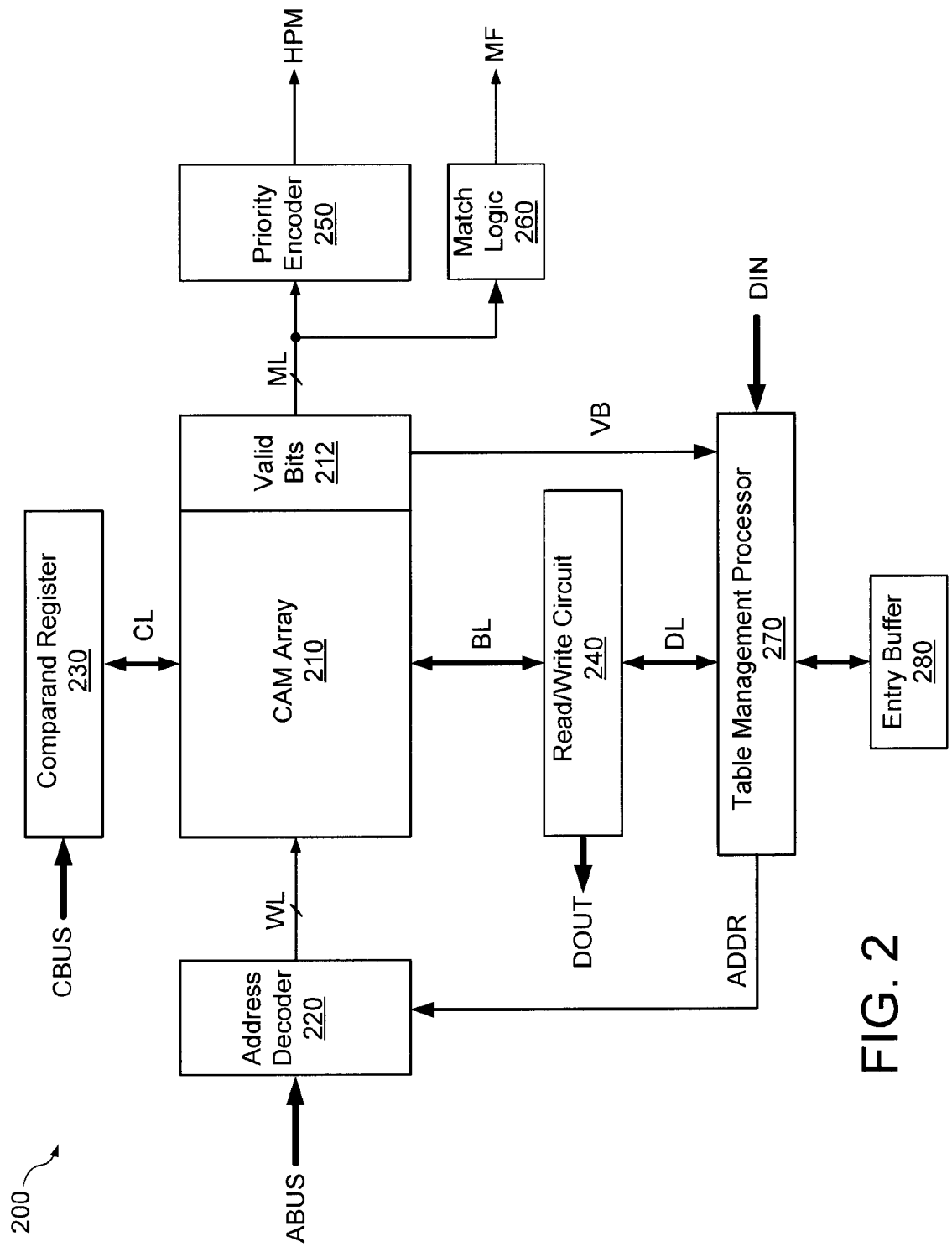
FIG. 2 is a block diagram of a content addressable memory (CAM) device within which the present embodiments may be implemented.

FIG. 2 is a block diagram of a CAM device within which the present embodiments may be implemented. CAM device 200 includes a CAM array 210, an address decoder 220, a comparand register 230, a read/write circuit 240, a priority encoder circuit 250, match logic 260, a table management processor 270, and an entry buffer 280. CAM array 210 includes any number of rows of CAM cells (not shown for simplicity in FIG. 2), where each row of CAM cells can be configured to store a data word (e.g., an IPv6 address having an associated prefix length) and to include a valid bit 212 that indicates whether a valid data word is stored in the row. Further, while CAM array 210 is shown in FIG. 2 as a single CAM array, it may include any number of CAM array blocks that can be independently searched.

One or more instructions and related control signals can be provided to CAM device 200 from an instruction decoder (not shown for simplicity) to control read, write, compare, and other operations for CAM device 200. Other well-known signals that can be provided to CAM device 200, such as enable signals, clock signals, and power connections, are not shown for simplicity.

Each row of CAM cells (not shown in FIG. 2 for simplicity) in CAM array 210 is coupled to address decoder 220 via a corresponding word line WL, and is coupled to priority encoder 250 and to match logic 260 via a corresponding match line ML. For simplicity, the word lines and match lines are represented collectively in FIG. 2. Address decoder 220 is well-known, and includes circuitry to select corresponding rows in CAM array 210 for read, write, and/or other operations, in response to an address received from an address bus ABUS using the word lines WL. For other embodiments, addresses may be provided to address decoder 220 from another suitable bus and/or circuitry.

The match lines ML provide match results for compare operations between comparand data (e.g., a search key) and data stored in CAM array 210. Priority encoder 250, which is well-known, uses the match results indicated on the match lines to determine the matching entry that has the highest priority number associated with it and generates the index or address of this highest priority match (HPM). In addition, priority encoder 250 may use the valid bits 212 from CAM array 210 to generate the next free address that is available in CAM array 210 for storing new data. Although not shown in FIG. 2, for some embodiments, priority encoder 250 may provide the next free address to the address decoder 220.

Match logic 260, which is well-known, uses the match results on the match lines to generate a match flag (MF) indicative of a match condition in CAM array 210. If there is more than one matching entry in CAM array 210, match logic 260 may generate a multiple match flag to indicate a multiple match condition. In addition, match logic 260 may use the valid bits 212 from CAM array 210 to assert a full flag when all of the rows of CAM cells in CAM array 210 are filled with valid entries.

Each column of CAM cells (not shown in FIG. 2 for simplicity) in CAM array 210 is coupled to comparand register 230 via one or more corresponding comparand lines CL, and is coupled to read/write circuit 240 via one or more corresponding bit lines BL. For simplicity, the comparand lines CL and bit lines BL are represented collectively in FIG. 2. Comparand register 230 is well-known, and is configured to provide a search key (e.g., a comparand word) received from a comparand bus CBUS to CAM array 210 during compare operations with data stored therein. For other embodiments, the search key can be provided to CAM array 210 via another bus and/or circuit. Read/write circuit 240 includes well-known write drivers to write data to CAM array 210 via the bit lines BL, and includes well-known sense amplifiers to read data from CAM array 210 as output data (DOUT). For other embodiments, read/write circuit 240 may be coupled to another data bus. Further, although not shown in FIG. 2 for simplicity, CAM device 200 can include a well-known global mask circuit (e.g., coupled to the comparand register 230) that can selectively mask the bits of the search key provided to the CAM array 210.

Table management processor 270 includes a data input for receiving entries (DIN) to be stored in CAM array 210, is coupled to read/write circuit 240 via one or more data lines DL, is coupled to entry buffer 280, and includes an output to provide write addresses (ADDR) to the address decoder 220. As mentioned above, table management processor 270 is configured to order a plurality of entries having various prefix lengths for storage in the CAM array 210 according to prefix length, to maintain the ordering relationship as new entries are inserted in the CAM array and/or as old entries are deleted from the CAM array. More specifically, for some embodiments, table management processor 270 selects a number (N) of the plurality of entries to be stored in the CAM array 210 and first stores the selected N entries in the buffer 280. The table management processor 270 analyzes the selected entries to generate a prefix length distribution graph that indicates how many of the selected entries have each prefix length. The prefix length distribution graph is then used to predict the prefix lengths of the remaining entries to be stored in the CAM array 210, and in response thereto, table management processor 270 allocates storage locations in the CAM array for entries to be subsequently stored according to prefix length, for example, so that entries having the same prefix length are stored in contiguous storage locations of the CAM array 210.

For example, for one embodiment, each unique prefix length associated with the selected entries is identified, and the percentages of the selected entries that have each unique prefix length are calculated. Then, the percentages embodied in the prefix length distribution graph are then multiplied by the total number of storage locations in the CAM array to determine how many storage locations should be allocated for each prefix length.

Although depicted in FIG. 2 as a hardware component, for other embodiments, the table management processor 270 can be implemented as a software program executed by a suitable processor in the control plane of an associated routing device, thereby allowing techniques of the present disclosure to be implemented in conventional CAM architectures without additional hardware components.

Figure 3:
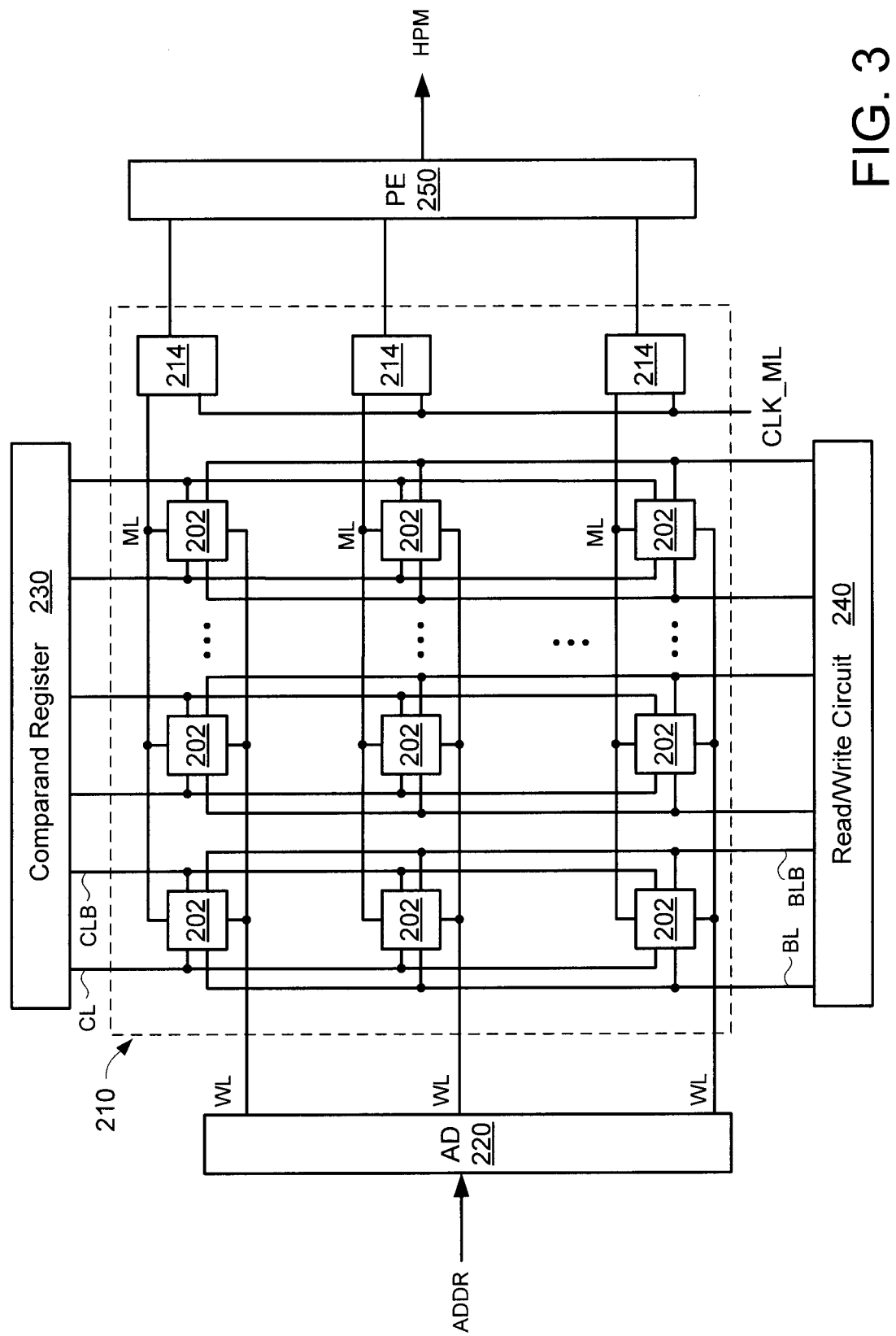
FIG. 3 is a block diagram of one embodiment of the CAM array of FIG. 2.

FIG. 3 is a more detailed block diagram of the CAM array 210 of FIG. 2. CAM array 210 is shown to include a plurality of CAM cells 202 organized in any number of rows and columns. The CAM cells 202 can be any suitable type of CAM cell including, for example, binary CAM cells, ternary CAM cells, and/or quaternary CAM cells. Of course, for IPv6 routing functions, ternary or quaternary CAM cells are used, and the entries are stored in the CAM array 210 according to prefix length (e.g., the longest prefixes are stored at the lowest physical CAM address and the shortest prefixes are stored at the highest physical CAM address) to achieve longest prefix match (LPM) functions. For some embodiments, LPM operations can be performed in CAM device 200 in the manner described in commonly owned U.S. Pat. No. 6,237,061. For other embodiments, LPM operations can be performed in CAM device 200 using other suitable techniques.

As noted above, each row of CAM array 210 may also include one or more valid bits. Each row of CAM cells 202 is coupled to a match line ML and to a word line WL. Each word line WL is driven by address decoder 220 (see also FIG. 2) to select one or more rows of CAM cells 202 for writing or reading. Each match line ML is coupled to priority encoder 250 via a corresponding match latch 214. The match latches 214 are clocked by a match latch clock signal CLK_ML in a well-known manner. Each column of CAM cells 202 in CAM array 210 is coupled to read/write circuit 240 via a complementary bit line pair BL/BLB, and to comparand register 230 via a complementary comparand line pair CL/CLB.

Prior to compare operations, the match lines are pre-charged (e.g., to logic high), and each set of complementary comparand line pairs CL/CLB are driven to the same predetermined logic level (e.g., to logic high). Then, during compare operations, the comparand register 230 provides the search key (i.e., the comparand word) to the CAM cells 202 by driving each pair of complementary comparand lines CL/CLB to opposite logic states indicative of the corresponding bit of the search key. For example, to provide a logic low comparand bit (C) to a column of CAM cells, the corresponding comparand line CL is driven to a first logic state (e.g., logic low) and the corresponding complementary comparand line CLB is driven to a second logic state (e.g., logic high); conversely, to provide a logic high comparand bit C to the column of CAM cells, the corresponding comparand line CL is driven to the second logic state (e.g., logic high) and the corresponding complementary comparand line CLB is driven to the first logic state (e.g., logic low). Thereafter, if all the CAM cells 202 in a particular row match the corresponding bits of the search key, then the match line ML remains in its logic high state to indicate the match condition. Conversely, if one or more of the CAM cells 202 in the row do not match the corresponding bit of the search key, then mismatching CAM cells 202 discharge the match line (e.g., to ground potential) to indicate the mismatch condition.

Figure 4:
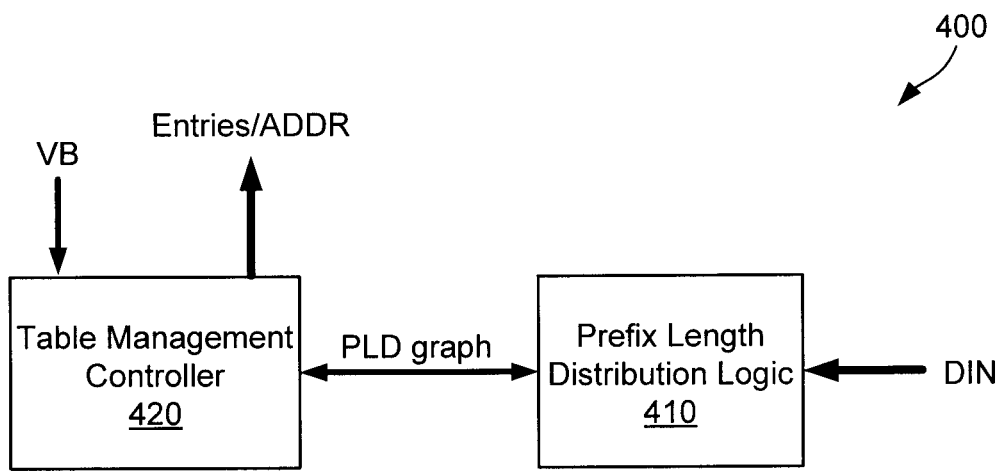
FIG. 4 is a block diagram of one embodiment of the table management processor of FIG. 2.

FIG. 4 is table management processor 400 that is one embodiment of the table management processor 270 of FIG. 2. The table management processor 400 is shown to include a prefix length distribution (PLD) logic 410, a table management controller 420, and a PLD memory 430. The PLD logic 410 includes an input to receive entries to be stored in the CAM array 210 (e.g., as input data DIN), and is configured to generate a PLD graph for the selected number N of entries. As mentioned above, the PLD graph indicates how many of the selected entries have each prefix length, and is used to predict how many of all the entries to be stored in the CAM array have each prefix length.

The table management controller 420, which can be any suitable type of table management tool, includes an input to receive the PLD graph from PLD logic 410, and includes an output to provide entries and write addresses to the CAM array for storage therein. In operation, table management controller 420 performs table update functions such as shuffling existing entries stored in the CAM array to make room for the insertion of new entries and/or the deletion of old entries according to the allocation of available storage locations in the CAM array, as predicted by the PLD graph generated by the PLD logic 410. For some embodiments, table management controller 420 preserves the ordering of entries stored in the CAM array 210 according to their prefix lengths in a well-known manner, and relies upon the PLD graph generated by the PLD logic 410 for the allocation of CAM array storage locations according to prefix length. In this manner, the allocation of storage locations according to prefix length is predicted using the PLD graph.

Software programs and/or instructions executed by table management controller 420 to perform table update functions can be stored in a suitable memory (not shown for simplicity) within or associated with table management controller 420. Further, for embodiments in which PLD logic 410 executes a software program and/or instructions to generation the PLD graph, these software programs and/or instructions can be stored in the associated memory.

Figure 5:
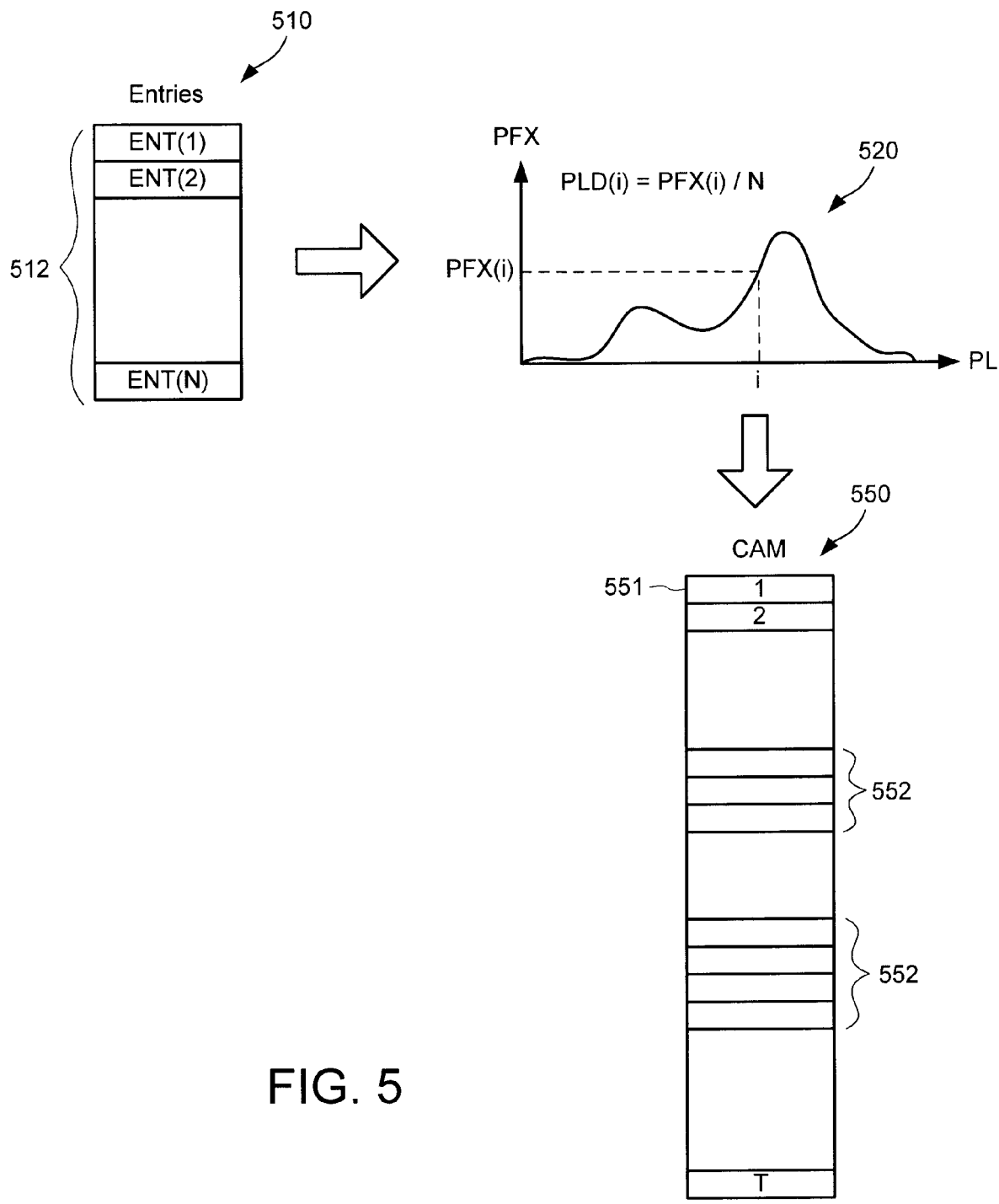
FIG. 5 is a functional diagram depicting the computation of a prefix length distribution (PLD) graph and an associated allocation of storage locations in the CAM array for storing entries ordered according to prefix length.

FIG. 5 is a functional diagram depicting the computation of a prefix length distribution (PLD) graph and an associated allocation of storage locations in the CAM array for storing entries ordered according to prefix length. More specifically, FIG. 5 depicts an entry buffer 510 that is one embodiment of entry buffer 280 of FIG. 2, an exemplary PLD graph 520, and an exemplary depiction 550 of storage locations 551 of CAM array 210 of FIG. 2. Entry buffer 510 is depicted as having N storage locations 512. PLD graph 520 depicts the number of entries that have each prefix length (PL). CAM array 550 is depicted as having T storage locations 551 for which the available storage locations or holes are labeled 552.

Referring also to FIG. 2, the table management processor 270 selects a number N of entries from a plurality P of entries to be stored in the CAM array 210, and stores the selected entries in corresponding locations 512 of buffer 510 as ENT(1)-ENT(N). For some embodiments, the selected number N is a small subset or fraction of the total number P of entries to be stored in the CAM array 210. For example, in some implementations, the first 10,000 entries of a total of 100,000 entries are selected.

Then, the table management processor 270 analyzes the prefix lengths of the selected entries ENT(1)-ENT(N) to generate the PLD graph 520, which as shown in FIG. 5 depicts the distribution of prefix lengths for the selected entries ENT(1)-ENT(N). More specifically, the PLD graph 520 of FIG. 5 illustrates the number of entries that have each prefix length (PL). Thus, the number of the selected entries ENT that have a given prefix length of i is denoted as PFX(i), and the percentage of the selected entries ENT(1)-ENT(N) that have a given prefix length of i is denoted as:

$$PLD(i)=PFX(i)/N \qquad (1)$$

For example, if there are 10,000 selected entries stored in the entry buffer 510 (i.e., N=10,000), and 50 of those selected 10,000 entries have a prefix length of 12 (i.e., PFX(12)=50), then the value of PLD(12) is calculated as 50/10,000=0.005.

For other embodiments, calculation of the PLD graph 520 can include other information and/or can be calculated using other suitable expressions.

After determining PLD values for all unique prefix lengths of the selected entries ENT(1)-ENT(N), the resulting PLD graph 520 can be used to predict how many holes 552 within CAM array 550 should be allocated to store entries of various corresponding prefix lengths. For some embodiments, the number of CAM holes 552 (NH(i)) allocated for entries having a given prefix length of i is determined by multiplying the PLD value for the prefix length i by the total number T of storage locations 551 in the CAM array, as follows:

$$NH(i)=PLD(i)*T \qquad (2)$$

For example, if PLD(12)=0.005, and T=100,000, the number of holes NH(12) allocated to entries having a prefix length of 12 is (0.005)*(100,000)=500. Similarly, the number of storage locations in the CAM array allocated for entries having other prefix lengths can be determined using expression (2).

Figures 6A, 6B:
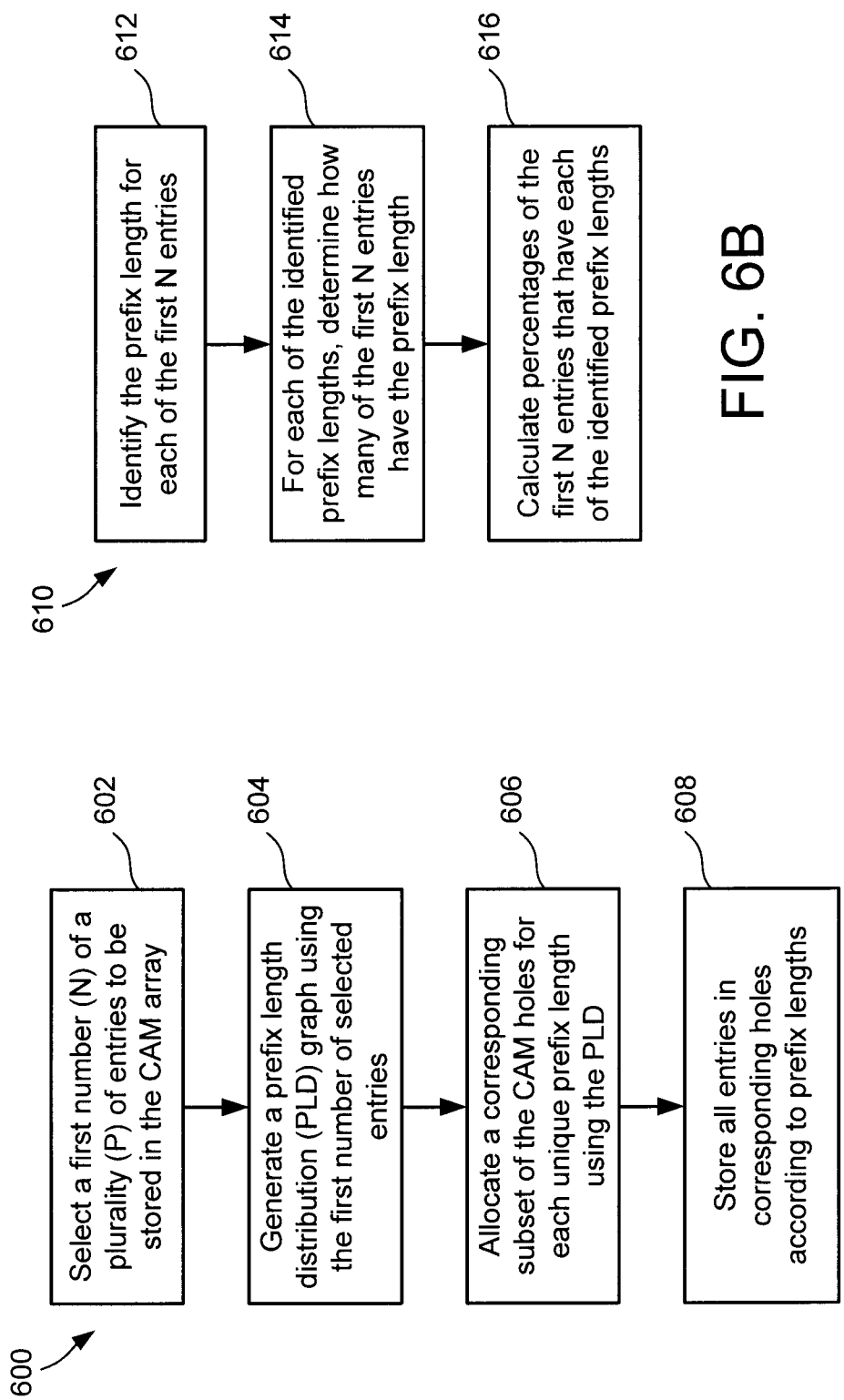
FIG. 6A is an illustrative flow chart depicting an exemplary allocation of storage locations in a CAM array for storing entries according to prefix lengths in accordance with some embodiments.
FIG. 6B is an illustrative flow chart depicting an exemplary generation of a PLD in accordance with some embodiments.

FIG. 6A is an illustrative flow chart 600 depicting an exemplary allocation of storage locations in a CAM array for storing entries according to prefix lengths in accordance with some embodiments. Referring also to FIG. 2, a first number (N) of a plurality (P) of entries to be stored in the CAM array 210 according to prefix length are selected (602). For some embodiments, the selected N entries are stored in the entry buffer 280 of FIG. 2. Then, the table management processor 270 generates a prefix length distribution (PLD) graph using the N selected entries (604). As described above, the PLD graph uses the selected number N of entries to predict the distribution of prefix lengths for the entire plurality of entries to be stored in the CAM array. Next, the PLD graph is used by the table management processor 270 to allocate a corresponding subset of the CAM holes for each unique prefix length (606). Then, the table management processor 270 stores all the entries in corresponding allocated CAM holes according to prefix length (608). For some embodiments, the table management processor 270 uses the PLD graph to store the plurality of entries in the CAM array 210 according to prefix length in accordance with the allocation of CAM holes generated using the PLD graph.

FIG. 6B is an illustrative flow chart 610 depicting an exemplary generation of a PLD graph (e.g., graph 520 of FIG. 5) in accordance with some embodiments. For some embodiments, the PLD graph is generated by the PLD logic 410 of FIG. 4. First, the prefix length of each of the selected number N of entries is identified (612). Next, for each identified prefix length, the number of the selected entries that have the prefix length is determined (614). Then, the percentages of the selected number N of entries that have each of the identified prefix lengths are calculated, for example, using expression (1) above (616).

Figure 6C:
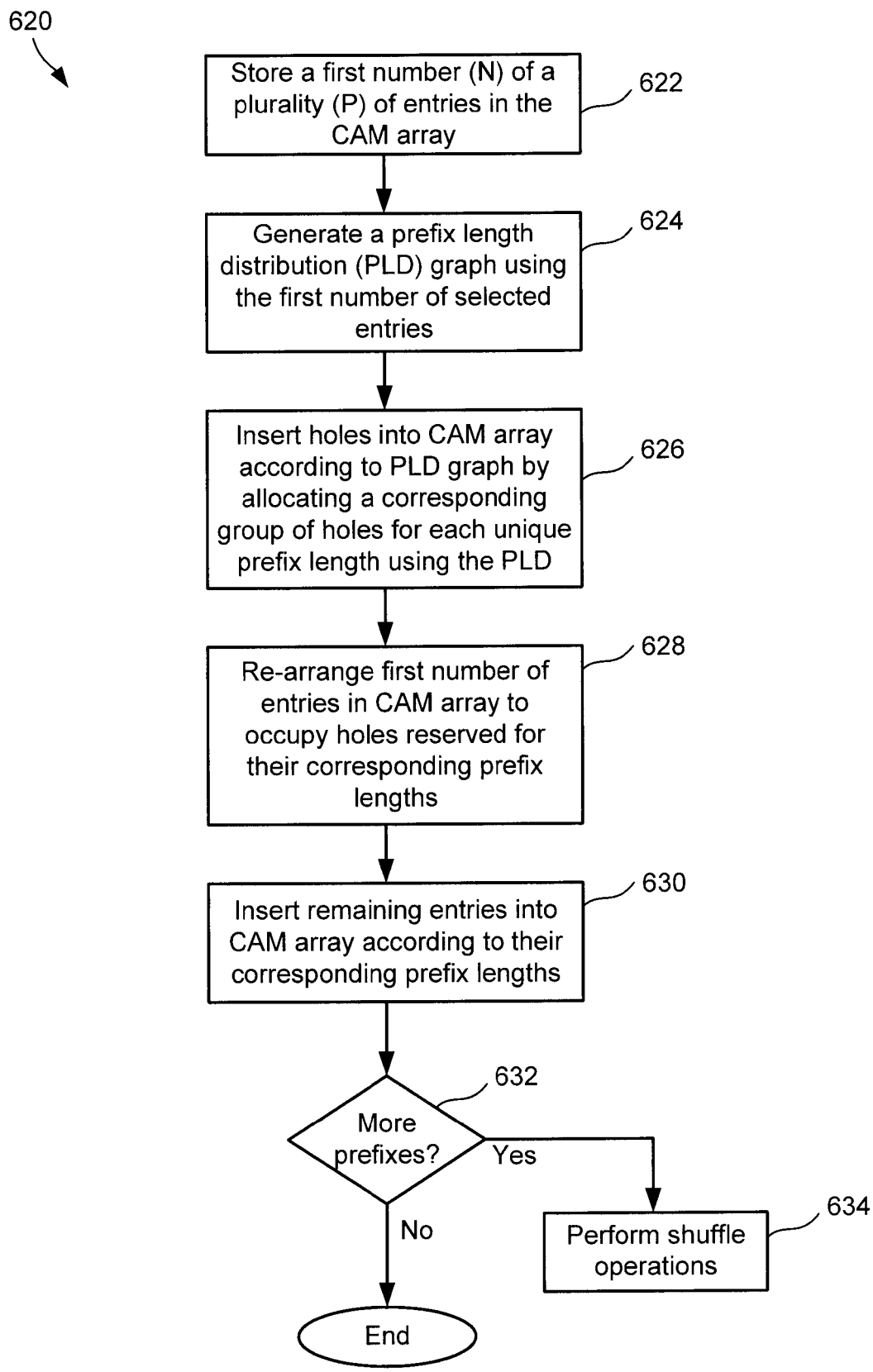
FIG. 6C is an illustrative flow chart depicting an exemplary allocation of storage locations in a CAM array for storing entries according to prefix lengths in accordance with other embodiments.

FIG. 6C is an illustrative flow chart 620 depicting an exemplary allocation of storage locations in a CAM array for storing entries according to prefix lengths in accordance with other embodiments. Referring also to FIG. 2, a first number (N) of a plurality (P) of entries are stored in the CAM array 210 (622). For some embodiments, the selected N entries are stored in the entry buffer 280 of FIG. 2. Then, the table management processor 270 generates a prefix length distribution (PLD) graph using the N selected entries (624). As described above, the PLD graph uses the selected number N of entries to predict the distribution of prefix lengths for the entire plurality of entries to be stored in the CAM array. Then, holes are inserted in the CAM array according to the PLD graph by allocating a corresponding group of holes for each unique prefix length (626). Note that the holes allocated for each unique prefix length have contiguous physical addresses so that entries having the same prefix length will be stored in a corresponding group of contiguous locations in the CAM array.

The table management processor 270 then re-arranges the first number N of selected entries in the CAM array to occupy holes reserved for their corresponding prefix lengths (628). Then, the table management processor 270 stores the remaining entries into the CAM array according to their prefix lengths (630). If there are not any remaining prefixes to be inserted, the process ends. Otherwise, if there are one or more remaining prefixes to be inserted (e.g., all of the holes are now occupied with valid data), as tested at 632, then the table management processor 270 performs shuffle operations to insert any remaining entries into the CAM array.

In the embodiments described above, the PLD graph 520 of FIG. 5 is used to predict prefix length distribution of all the prefixes to be stored in the CAM array. To measure the accuracy of the prediction, the predicted prefix length distribution is compared with a number of actual prefix length distributions using the well-known Root Mean Square (RMS) error function. As known in the art, RMS error can be used to measure the difference between the values predicted by a model and the actual values. RMS error is calculated as follows:

$$e = \sqrt{\frac{\sum_{i=1}^{l}(p_i - a_i)^2}{l}} \qquad (3)$$

where $p_i$ is the predicted percentage of prefixes of length i, $a_i$ is the actual percentage of prefixes of length i, and l is the largest prefix length. The lower the RMS error, the greater is the accuracy of the prediction model. Results of such comparisons are described with respect to FIG. 7 below.

Figure 7:
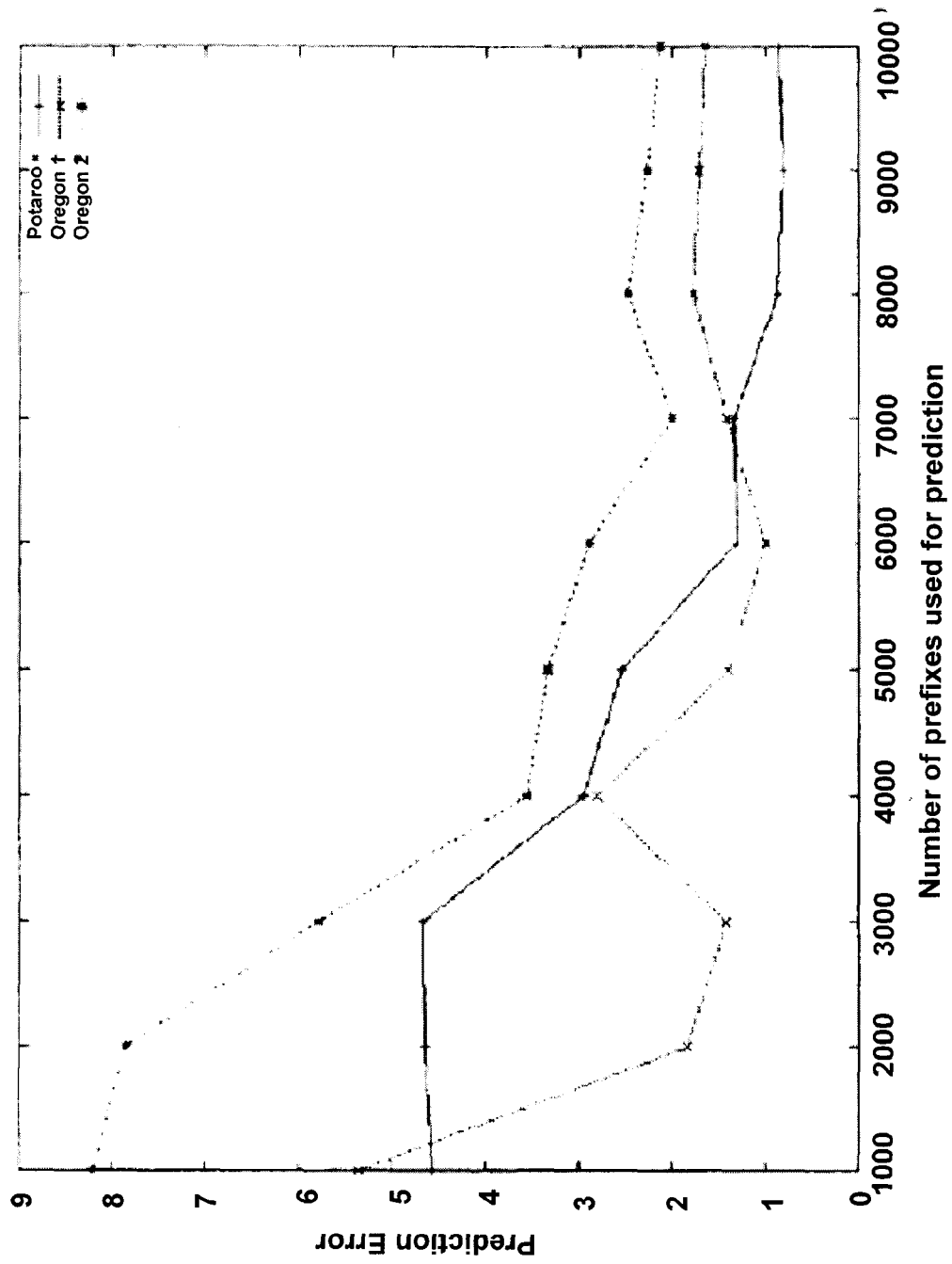
FIG. 7 is a diagram showing RMS Errors in prefix length distribution prediction in accordance with some embodiments.

FIG. 7 is a diagram showing RMS errors in prefix length distribution prediction to determine the relationship between the number N of entries selected for generating the PLD graph and the associated prediction errors. In this manner, the relationship between RMS error and the number of selected entries can be used as a guide to choose a suitable number of entries to select for generating the PLD graph. The RMS prediction errors shown in FIG. 7 correspond to network routing traces for which the number N of entries used for prediction is varied between 1,000 and 10,000. Traces are used from three well-known databases: potaroo, oregon-1, and oregon-2. Although the predicted errors decline as the number N of entries selected for prefix length prediction increases, the selected number N of entries used for prediction is limited for practical reasons (e.g., size of entry buffer 510, computation time, and so on). Thus, note that when selecting about 10% of the entries for prediction (e.g., selecting 10,000 out of a total of 100,000 entries), the prediction error drops to less than 3%, which Applicant deems as an acceptable value.

Figure 8A:
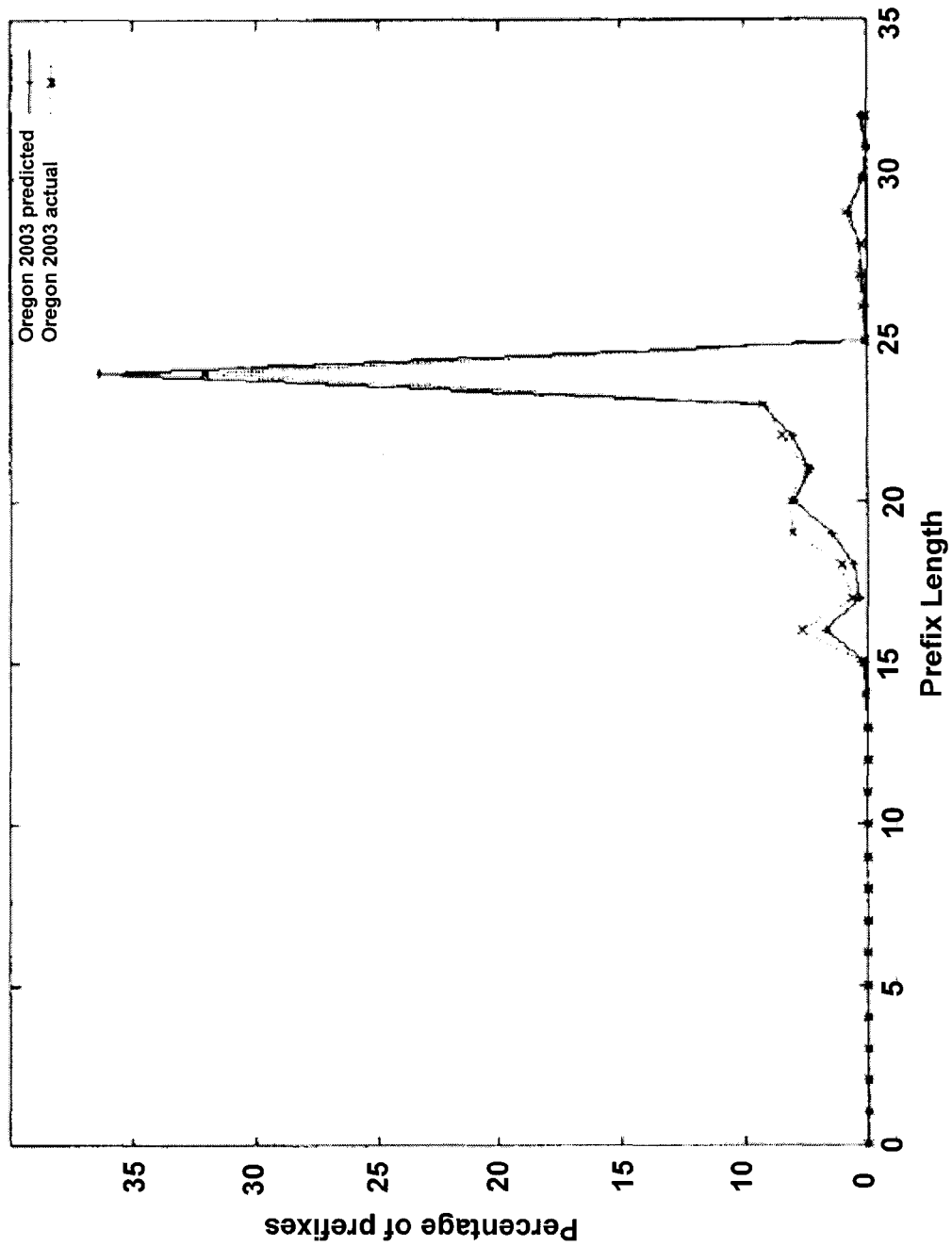
FIGS. 8A-8C depict exemplary comparisons of predicted and actual prefix length distribution in accordance with some embodiments.
Figure 8B:
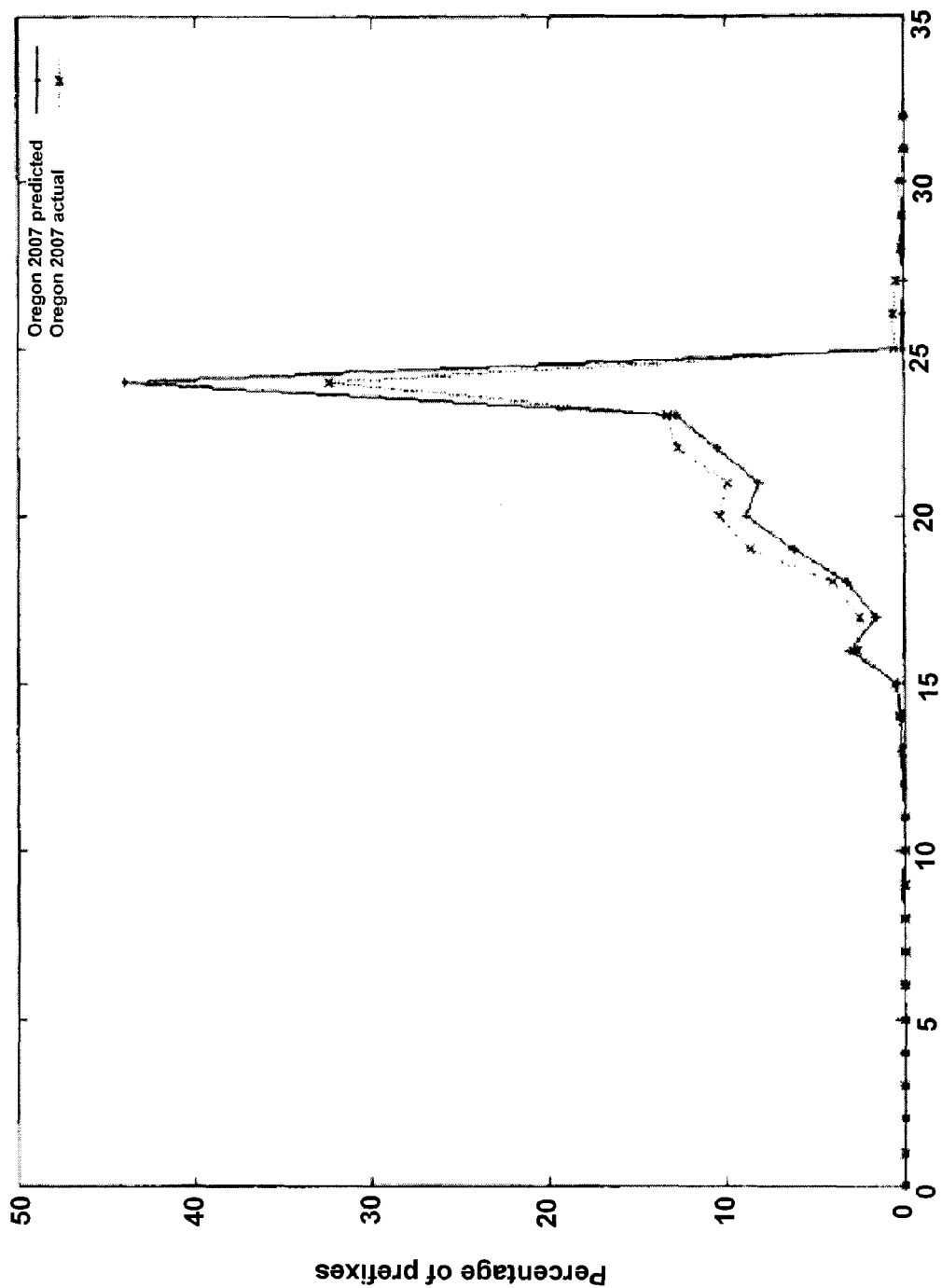
Figure 8C:
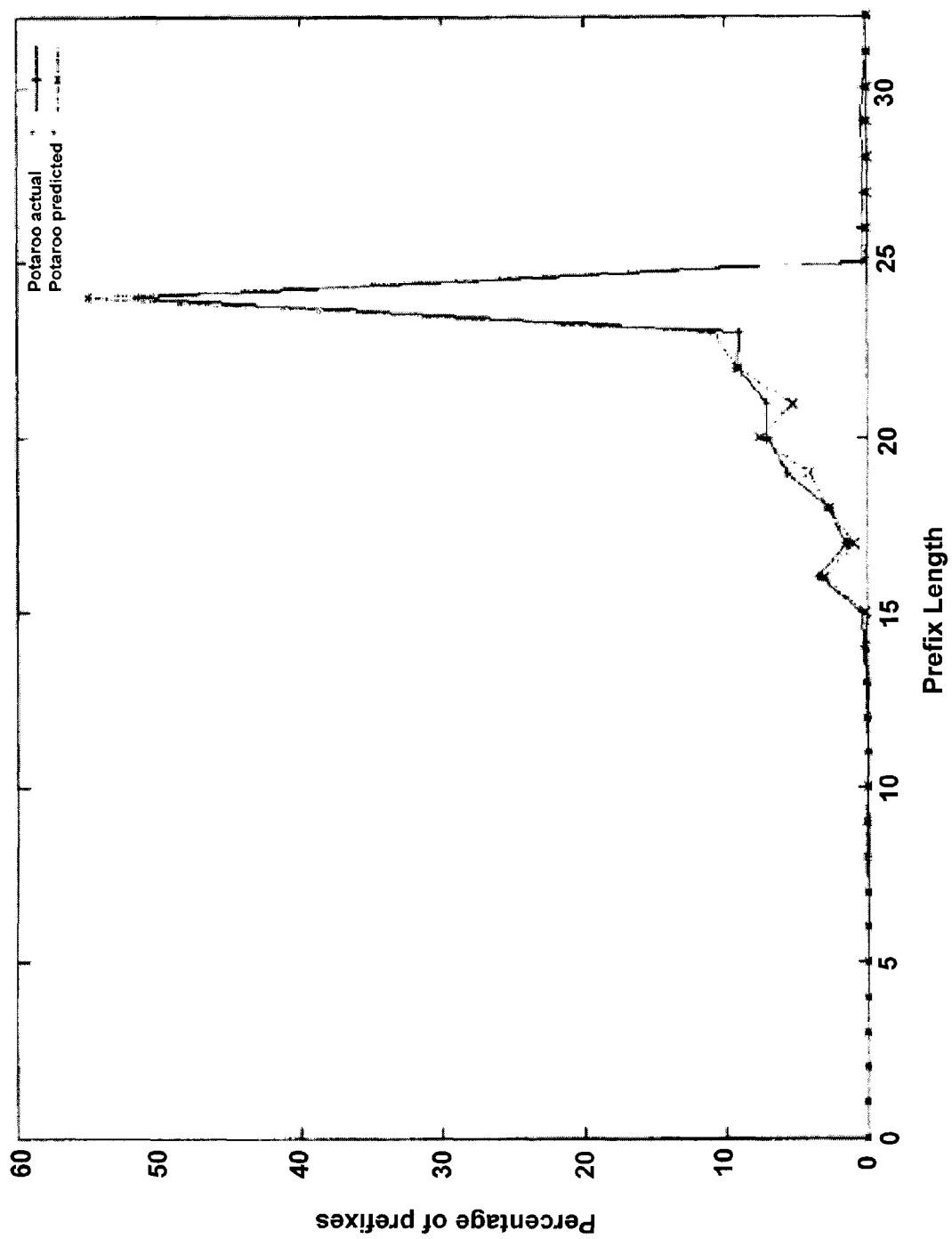

FIGS. 8A-8C show comparisons of predicted prefix length distribution and actual prefix length distribution in accordance with some embodiments, where FIG. 8A compares the predicted and actual prefix length distribution for the oregon-1 trace, FIG. 8B compares the predicted and actual prefix length distribution for the oregon-2 trace, and FIG. 8C compares the predicted and actual prefix length distribution for the potaroo trace. Each of the traces contains 100,000 entries, and can be obtained online from routeviews.org. As illustrated by FIGS. 8A-8C, the predicted prefix length distribution generated by present embodiments is very close to the actual prefix length distribution for the corresponding trace entries. This indicates that a substantially accurate prediction of the prefix length distribution can be made by selecting the first 10,000 entries of any set of entries to generate the PLD graph for allocating CAM storage locations for the entire set of entries according to prefix length.

Applicant has verified that the prefix length prediction techniques set forth by the present embodiments result in fewer shuffles than the 3 conventional hole allocation techniques commonly referred to as No Hole Allocation, Uniform Hole Distribution, and Center Hole Distribution.

For example, FIG. 9A compares prefix length prediction techniques of the present disclosure and the 3 conventional techniques (i.e., No Hole Allocation, Uniform Hole Distribution, and Center Hole Distribution) using the Oregon-1 trace collected in 2003. Note that that the No Holes Allocation technique requires the maximum number of shuffles. There is no significant reduction in the number of shuffles using the Uniform Hole Distribution technique or the Center Hole Distribution technique. However, using prefix distribution prediction techniques of the present embodiments results in a substantial reduction in the number of shuffles. For example, the prefix distribution prediction technique disclosed herein requires only 15% of the shuffles that occur in the No Holes Allocation technique, only 16.5% of the shuffles that occur in the Uniform Hole Distribution technique, and only 18.1% of the shuffles that occur in the Center Hole Distribution technique.

FIG. 9B compares prefix length prediction techniques of the present disclosure and the 3 conventional techniques (i.e., No Hole Allocation, Uniform Hole Distribution, and Center Hole Distribution) using the Oregon-2 trace collected in 2007. The prefix distribution prediction techniques of the present embodiments requires significantly fewer shuffles than the 3 conventional techniques. For example, the prefix distribution prediction technique disclosed herein requires only 12.6% of the shuffles that occur in the No Holes Allocation technique, only 16.6% of the shuffles that occur in the Uniform Hole Distribution technique, and only 18.4% of the shuffles that occur in the Center Hole Distribution technique.

FIG. 9C compares prefix length prediction techniques of the present disclosure and the 3 conventional techniques (i.e., No Hole Allocation, Uniform Hole Distribution, and Center Hole Distribution) using the Potaroo trace collected in 2009. The prefix distribution prediction techniques of the present embodiments requires significantly fewer shuffles than the 3 conventional techniques For example, the prefix distribution prediction technique disclosed herein requires only 8% of the shuffles that occur in the No Holes Allocation technique, only 9.5% of the shuffles that occur in the Uniform Hole Distribution technique, and only 11% of the shuffles that occur in the Centre Hole Distribution technique. The results show that the prefix distribution prediction technique of the present embodiments outperforms the conventional techniques. More specifically, the reduction in number of shuffles achieved by the prefix length distribution prediction technique disclosed herein advantageously results in a proportional increase in the CAM array update speeds.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure. Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages.

What is claimed is:

1. A method for ordering a plurality (P) of entries having various prefix lengths for storage in a number (T) of available storage locations in a content addressable memory (CAM) array according to the prefix lengths, the method comprising:
   selecting a first number (N) of the entries, wherein N<P;
   generating a distribution graph of the prefix lengths of the first N entries;
   for each unique prefix length, allocating a corresponding subset of the T storage locations in the CAM array according to the distribution graph; and
   storing all P entries in the corresponding allocated storage locations.

2. The method of claim 1, wherein increasing numerical CAM storage location addresses correspond to entries having decreasing prefix lengths.

3. The method of claim 1, wherein the number N is selected in response to a relationship between numbers of entries selected for generating the distribution graph and associated errors in predicting the prefix lengths of the remaining entries.

4. The method of claim 1, wherein all entries having the same prefix length are stored in contiguous storage locations of the CAM array.

5. The method of claim 1, wherein the distribution graph indicates how many of the first N entries have each of the prefix lengths.

6. The method of claim 1, wherein the distribution graph predicts how many of the P entries have each of the prefix lengths.

7. The method of claim 1, wherein the generating comprises:
identifying the prefix length of each of the first N entries;
for each of the identified prefix lengths, determining how many of the first N entries have the prefix length; and
calculating percentages of the first N entries that have each of the identified prefix lengths.

8. The method of claim 7, wherein each percentage is expressed as PLD(i)=M(i)/N, where PLD(i) is the percentage of the N entries that have a prefix length of i, M(i) is the number of the first N entries that have the prefix length of i, and i is an integer greater than zero.

9. The method of claim 8, wherein the allocating comprises:
for each unique prefix length, calculating the corresponding subset of the P storage locations as NH(i)=PLD(i)*T, where NH(i) is the number of storage locations allocated to store entries having a prefix length of i.

10. The method of claim 1, wherein the selecting comprises:
storing the first N entries in a buffer that is separate from the CAM array.

11. A processor configured to order a plurality (P) of entries having various prefix lengths for storage in a number (T) of available storage locations in a content addressable memory (CAM) array according to the prefix lengths, the processor comprising:
means for selecting a first number (N) of the entries, wherein N<P;
means for generating a distribution graph of the prefix lengths of the first N entries;
for each unique prefix length, means for allocating a corresponding subset of the T storage locations in the CAM array according to the distribution graph; and
means for storing all P entries in the corresponding allocated storage locations.

12. The processor of claim 11, wherein increasing numerical CAM storage location addresses correspond to entries having decreasing prefix lengths.

13. The processor of claim 11, wherein all entries having the same prefix length are stored in contiguous storage locations of the CAM array.

14. The processor of claim 11, wherein the number N is selected in response to a relationship between numbers of entries selected for generating the distribution graph and associated errors in predicting the prefix lengths of the remaining entries.

15. The processor of claim 11, wherein the distribution graph indicates how many of the first N entries have each of the prefix lengths.

16. The processor of claim 11, wherein the distribution graph predicts how many of the P entries have each of the prefix lengths.

17. The processor of claim 11, wherein the means for generating comprises:
means for identifying the prefix length of each of the first N entries;
for each of the identified prefix lengths, means for determining how many of the first N entries have the prefix length; and
means for calculating percentages of the first N entries that have each of the identified prefix lengths.

18. The processor of claim 17, wherein each percentage is expressed as PLD(i)=M(i)/N, where PLD(i) is the percentage of the N entries that have a prefix length of i, M(i) is the number of the first N entries that have the prefix length of i, and i is an integer greater than zero.

19. The processor of claim 18, wherein the means for allocating calculates, for each unique prefix length, the corresponding subset of the P storage locations as NH(i)=PLD(i)*T, where NH(i) is the number of storage locations allocated to store entries having a prefix length of i.

20. The processor of claim 11, wherein the means for selecting stores the first N entries in a buffer that is separate from the CAM array.

21. A system for storing a plurality (P) of entries according to their prefix lengths, comprising:
a data input to receive the plurality of entries;
a content addressable memory (CAM) array having a number (T) of storage locations, each for storing a corresponding one of the entries;
a buffer to store a first number (N) of the received entries, wherein N<P;
logic configured to generate a distribution graph of the prefix lengths of the first N entries, wherein the distribution graph indicates how many of the first N entries have each prefix length and predicts how many of the P entries have each prefix length; and
a processor configured to allocate, for each unique prefix length, a corresponding subset of the T storage locations in the CAM array for storing entries that have the unique prefix length.

22. The system of claim 21, wherein increasing numerical CAM storage location addresses correspond to entries having decreasing prefix lengths.

23. The system of claim 21, wherein all entries having the same prefix length are stored in contiguous storage locations of the CAM array.

24. The system of claim 21, wherein the number N is selected in response to a relationship between numbers of entries selected for generating the distribution graph and associated errors in predicting the prefix lengths of the remaining entries.

25. The system of claim 21, wherein the logic generates the distribution graph by:
identifying the prefix length of each of the first N entries;
for each of the identified prefix lengths, determining how many of the first N entries have the prefix length; and
calculating percentages of the first N entries that have each of the identified prefix lengths.

26. The system of claim 25, wherein each percentage is expressed as PLD(i)=M(i)/N, where PLD(i) is the percentage of the N entries that have a prefix length of i, M(i) is the number of the first N entries that have the prefix length of i, and i is an integer greater than zero.

27. The system of claim 26, wherein the processor calculates, for each unique prefix length, the corresponding subset of the P storage locations as NH(i)=PLD(i)*T, where NH(i) is the number of storage locations allocated to store entries having a prefix length of i.

* * * * *